United States Patent
Terabe et al.

(10) Patent No.: US 9,577,788 B2
(45) Date of Patent: Feb. 21, 2017

(54) CODING APPARATUS, CODING METHOD, DATA COMMUNICATION APPARATUS, AND DATA COMMUNICATION METHOD

(75) Inventors: Masayoshi Terabe, Dusseldorf (DE); Hirofumi Yamamoto, Obu (JP)

(73) Assignee: DENSO CORPORATION, Kariya (JP)

( * ) Notice: Subject to any disclaimer, the term of this patent is extended or adjusted under 35 U.S.C. 154(b) by 959 days.

(21) Appl. No.: 13/494,166

(22) Filed: Jun. 12, 2012

(65) Prior Publication Data

US 2012/0324320 A1     Dec. 20, 2012

(30) Foreign Application Priority Data

Jun. 15, 2011   (JP) ................................ 2011-133179
Jul. 12, 2011   (JP) ................................ 2011-153836

(Continued)

(51) Int. Cl.
*H04L 1/00*   (2006.01)
*H04L 1/16*   (2006.01)

(Continued)

(52) U.S. Cl.
CPC ............ *H04L 1/0061* (2013.01); *G06F 11/10* (2013.01); *H03M 13/09* (2013.01); *H04L 1/0073* (2013.01);

(Continued)

(58) Field of Classification Search
CPC .... H04L 1/1809; H04L 1/0071; H04L 1/0057; H04L 1/0061; H04L 1/0073; H04L 1/0081; H04L 1/1607; H04L 25/4908; G06F 11/10; H03M 13/09
See application file for complete search history.

(56) References Cited

U.S. PATENT DOCUMENTS 4,530,088 A   7/1985   Hamstra et al.
5,001,642 A   3/1991   Botzenhardt et al.
(Continued)

FOREIGN PATENT DOCUMENTS

JP   A-S61-39659      2/1986
JP   10-233700 A      9/1998
(Continued)

OTHER PUBLICATIONS

Office Action mailed Jul. 30, 2013 issued in corresponding JP patent application No. 2011-195036 (and English translation).
(Continued)

*Primary Examiner* — April Y Blair
*Assistant Examiner* — Dipakkumar Gandhi
(74) *Attorney, Agent, or Firm* — Posz Law Group, PLC

(57) ABSTRACT

A 4B5B encoder converts an inputted 4-bit data into a pattern of a 5-bit data in which (i) the number of bits of consecutive "0" data values is permitted to be maximum two, and, simultaneously, (ii) maximum one bit of head end two bits is permitted to have a "0" data value and maximum one bit of tail end two bits is permitted to have a "0" data value. A 5N-bit command encoder converts a command into a command pattern in which the number of bits contained in consecutive "0" data values is permitted to be maximum two. The data after the conversion and the command after the conversion are converted into NRZI codes by an NRZI encoder.

18 Claims, 26 Drawing Sheets

(30) Foreign Application Priority Data

Sep. 7, 2011 (JP) ................................ 2011-195036
Sep. 7, 2011 (JP) ................................ 2011-195037

(51) Int. Cl.

| | | |
|---|---|---|
| H04L 25/49 | (2006.01) | |
| G06F 11/10 | (2006.01) | |
| H03M 13/09 | (2006.01) | |
| H04L 5/18 | (2006.01) | |

(52) U.S. Cl.

CPC ........... *H04L 1/0081* (2013.01); *H04L 1/1607* (2013.01); *H04L 25/4908* (2013.01)

(56) References Cited

U.S. PATENT DOCUMENTS

| | | | |
|---|---|---|---|
| 5,210,751 | A | 5/1993 | Onoe et al. |
| 5,473,665 | A * | 12/1995 | Hall ................. H04J 3/14 379/22 |
| 6,405,338 | B1 | 6/2002 | Sinha et al. |
| 6,873,630 | B1 | 3/2005 | Muller et al. |
| 6,961,326 | B1 | 11/2005 | Chang et al. |
| 2008/0141105 | A1 | 6/2008 | Fujita |
| 2008/0225173 | A1 | 9/2008 | Miyasaka et al. |
| 2010/0097249 | A1 * | 4/2010 | Tsubota .................. H03M 9/00 341/100 |
| 2010/0192048 | A1 | 7/2010 | Washio et al. |

FOREIGN PATENT DOCUMENTS

| | | |
|---|---|---|
| JP | 11-032077 A | 2/1999 |
| JP | 2000-151747 A | 5/2000 |
| JP | 2001069181 A * | 3/2001 |
| JP | A-2001-69181 | 3/2001 |
| JP | 2009-202720 A | 9/2009 |

OTHER PUBLICATIONS

Office Action mailed Jul. 30, 2013 issued in corresponding JP patent application No. 2011-195037 (and English translation).
Raj Jain. "Error Characteristics of Fiber Distributed Data Interface (FDDI)." IEEE Transactions on Communications, vol. 38, No. 8, Aug. 1990, p. 1244-1252.
Office Action mailed May 14, 2013 in corresponding JP patent application No. 2011-133179 (and English translation).
Office Action mailed May 28, 2013 in corresponding JP patent application No. 2011-153836 (and English translation).
Office Action dated Sep. 16, 2014 issued in corresponding CN patent application No. 201210201494.0 (and English translation).
Office Action dated May 26, 2015 issued in corresponding CN patent application No. 201210201494.0 (and English translation).
Chinese Office Action dated Dec. 15, 2015 in the corresponding CN application No. 201210201494.0 (English translation attached).
Article in Wikipedia. "Group Coded Recording" Version of Jun. 16, 2010. [retrieved on Dec. 10, 2015.] Retrieved from the Internet. <https://de.wikipedia.org/w/index.php?title=Group_Coded_Recording&oldid=75635032> (English translation from Wikipedia attached).
DE Office Action dated Dcec. 10, 2015 in the corresponding DE application No. 102012210119.5 (English translation attached).

* cited by examiner

| MEANING | 4BIT | 5BIT |
|---|---|---|
| 0 | 0000 | 11110 |
| 1 | 0001 | 01001 |
| 2 | 0010 | 01101 |
| 3 | 0011 | 10101 |
| 4 | 0100 | 01010 |
| 5 | 0101 | 01011 |
| 6 | 0110 | 01110 |
| 7 | 0111 | 01111 |
| 8 | 1000 | 10010 |
| 9 | 1001 | 10011 |
| A | 1010 | 10110 |
| B | 1011 | 10111 |
| C | 1100 | 11010 |
| D | 1101 | 11011 |
| E | 1110 | 11001 |
| F | 1111 | 11101 |
| COMMAND PATTERN 1 | – | 11111 |
| COMMAND PATTERN 2 | – | 00110 |
| COMMAND PATTERN 3 | – | 00101 |
| COMMAND PATTERN 4 | – | 00111 |
| COMMAND PATTERN 5 | – | 01100 |
| COMMAND PATTERN 6 | – | 10100 |
| COMMAND PATTERN 7 | – | 11100 |

DATA { (rows 0 through F)

| COMMAND NO. | 1ST HALF | 2ND HALF |
|---|---|---|
| 1-33 | XXXX1 DATA, COMMAND PATTERN 1 (11) | COMMAND PATTERNS 2 TO 4 (3) |
| 34-66 | COMMAND PATTERNS 5 TO 7 (3) | 1XXXX DATA, COMMAND PATTERN 1 (11) |

FIG. 5

| COMMAND NO. | 1ST HALF | 2ND HALF |
|---|---|---|
| 1 | 11111 | 11111 |
| 2 | 11111 | 00110 |
| 3 | 11111 | 00101 |
| 4 | 11111 | 00111 |
| 5 | 01100 | 11111 |
| 6 | 10100 | 11111 |
| 7 | 11100 | 11111 |

FIG. 10

| FRAME | EXPLAIN | COMM. FREQ | LENGTH | IDENTIFIER |
|---|---|---|---|---|
| DATA FRAME (12bit ID) | TO READ/WRITE OF DATA ≤8 BYTE FOR 12-BIT ID SPACE | 1 | 1 | 0 |
| ACK FRAME | TO ISSUE AT NORMAL RECEPTION OF FRAME | 2 | 3 | 100 |
| COMMAND FRAME | TO TRANSMIT COMMAND | 3 | 3 | 101 |
| DATA FRAME (4bit ID) | TO READ/WRITE OF DATA 1BYTE FOR 4-BIT SPACE | (EXPAND) | 3 | 110 |
| DATA FRAME (16bit ID) | TO READ/WRITE OF DATA ≤8 BYTE FOR 16-BIT SPACE | (EXPAND) | 5 | 11100 |
| DATA FRAME (24bit ID) | TO READ/WRITE OF DATA ≤8 BYTE FOR 24-BIT SPACE | (EXPAND) | 5 | 11101 |
| DATA FRAME (32bit ID) | TO READ/WRITE OF DATA ≤8 BYTE FOR 32-BIT SPACE | (EXPAND) | 5 | 11110 |
| BURST FRAME (12bit ID) | TO READ/WRITE OF DATA ≤16 BYTE FOR 12-BIT SPACE | (EXPAND) | 7 | 1111100 |
| BURST FRAME (32bit ID) | TO READ/WRITE OF DATA ≤16 BYTE FOR 32-BIT SPACE | (EXPAND) | 7 | 1111101 |
| RESERVE | TO RESERVE EXPANSION | | | 111111* |

FIG. 17

| ERROR CLASS | NODE |
|---|---|
| BIT | TRANSMISSION |
| CODING | RECEPTION |
| CRC | RECEPTION |
| FORM | RECEPTION |
| STATE | RECEPTION |
| TIMEOUT | RECEPTION |

FIG. 20

| FRAME | EXPLAIN | COMM. FREQ | LENGTH | IDENTIFIER |
|---|---|---|---|---|
| DATA FRAME (12bitID) | TO READ/WRITE OF DATA ≤8 BYTE FOR 12-BIT ID SPACE | 1 | 1 | 0 |
| ACK FRAME | TO ISSUE AT NORMAL RECEPTION OF FRAME | 2 | 3 | 100 |
| COMMAND FRAME | TO TRANSMIT COMMAND | 3 | 3 | 101 |
| DATA FRAME (4bitID) | TO READ/WRITE OF DATA 1BYTE FOR 4-BIT SPACE | (EXPAND) | 3 | 110 |
| DATA FRAME (16bitID) | TO READ/WRITE OF DATA ≤8 BYTE FOR 16-BIT SPACE | (EXPAND) | 5 | 11100 |
| DATA FRAME (24bitID) | TO READ/WRITE OF DATA ≤8 BYTE FOR 24-BIT SPACE | (EXPAND) | 5 | 11101 |
| DATA FRAME (32bitID) | TO READ/WRITE OF DATA ≤8 BYTE FOR 32-BIT SPACE | (EXPAND) | 5 | 11110 |
| BURST FRAME (12bitID) | TO READ/WRITE OF DATA ≤16 BYTE FOR 12-BIT SPACE | (EXPAND) | 7 | 1111100 |
| BURST FRAME (32bitID) | TO READ/WRITE OF DATA ≤16 BYTE FOR 32-BIT SPACE | (EXPAND) | 7 | 1111101 |
| RESERVE | TO RESERVE EXPANSION | | | 111111* |

CODING APPARATUS, CODING METHOD, DATA COMMUNICATION APPARATUS, AND DATA COMMUNICATION METHOD

CROSS REFERENCE TO RELATED APPLICATION

This application is based on Japanese Patent Applications No. 2011-133179 filed on Jun. 15, 2011, No. 2011-153836 filed on Jul. 12, 2011, No. 2011-195036 filed on Sep. 7, 2011, and No. 2011-195037 filed on Sep. 7, 2011, the disclosures of which are incorporated herein by reference.

TECHNICAL FIELD

The present disclosure relates to a coding apparatus and a coding method, which code data and command into a format suitable for clock extraction.

Furthermore, the present disclosure relates to a data communication method and a data communication apparatus, which communicate a frame containing data.

BACKGROUND

[Patent document 1] JP S59-214358 A
[Patent document 2] JP 2001-69181 A
[Patent document 3] JP 2008-257221 A (US 2008/0225173)
[Patent document 4] JP S61-195453 A (U.S. Pat. No. 5,001,642 B1)
[Patent document 5] JP H11-317675 A (U.S. Pat. No. 6,405,338 B1)

First, in cases that a clock is extracted from reception data in a digital data transmission, it becomes difficult when the reception data contains consecutive same values. This may be overcome by using Manchester code. On the other hand, Manchester code needs a band twice the amount of information. There is proposed a technology of converting the binary data to easily execute the clock extraction by combining 4B5B conversion and NRZI coding such as 100 BASE-FX used for Ethernet (registered trademark), for instance.

The NRZI code makes the clock extraction easier since the waveform continuously changes when the data value "1" continues. In contrast, when the data value "0" continues, the waveform does not change. Thus, how to delete the pattern containing the consecutive data values "0s" is an issue. Patent document 1 discloses a method to convert a 4-bit data (0x-Fx) into a 5-bit data that has one data value "0" at a head portion and the maximum two data values "0s" at a tail portion, thereby setting the maximum bit length undergoing no edge to "4." Herein, the edge is a variation between "0" and "1." This method does not sufficiently suppress the maximum bit length. In addition, there is no special regularity about commands used for communication; the pattern is assigned to each command individually. The number of the commands which can be used are naturally limited.

Patent document 2 discloses a method to remove a command from a target for coding, thereby converting into a 5-bit data containing the maximum one data value "0" at a head portion and also the maximum one data value '0" at a tail portion. The maximum bit length undergoing no edge is thereby set to "3."

The method of Patent document 2 needs to express a frame other than data or a delimiter (one classification of a command) that indicates a boundary of the frame, only by using a specific pattern. Thus, the method of Patent document 2 limits setting of command codes.

Second, there is known a data communication method which assigns a data frame with an identifier to identify the data frame and transmits the data frame to a communication path. For example, Patent document 3 discloses a technology in which a shorter lengthened identifier is assigned to a shorter lengthened data frame, whereas a longer lengthened identifier is assigned to a longer lengthened data frame.

However, in the technology by Patent document 3, when the communication frequency of the longer lengthened data frame is higher than the communication frequency of the shorter lengthened data frame, the communication frequency of the longer lengthened identifier is higher than the communication frequency of the shorter lengthened identifier. This decreases the communication efficiency of the communication network as a whole.

Third, there is conventionally widely known CAN (Controller Area Network) as LAN (Local Area Network) that requires a high reliability (for example, refer to Patent document 4). CAN secures a reliability in the bit rate below 500 k bps using a stack error detection, a bit error detection, a form error detection, an acknowledge error detection, a CRC (Cyclic Redundancy Check) error detection, etc.

Further, there is recently a trend in the communication system to require a data communication speed improvement (several 100M bps or greater) and a high reliability. It is not so easy for CAN to provide a sufficient reliability as a communication system providing a non-collision or clock reproduction necessary for the data communication speed improvement, because of the specific frame structure in CAN.

Fourth, there is known a data communication in which a transmission side transmits a data frame attached with an error detection code such as a CRC, and a reception side detects an error of the reception data using the error detection code and requests re-transmission of the relevant communication frame if detecting an error (for example, refer to Patent document 5).

Such an error detection is only applied to the data but not applied to a header portion of the data frame since the header portion has fewer bits than the data portion and is not assumed to undergo any error detection.

SUMMARY

It is a first object of the present disclosure to provide a coding apparatus and a method of coding, which set flexibly a command code while preventing a decrease of a frequency in changes of data values.

It is a second object of the present disclosure to provide a data communication method and a data communication apparatus, which raise a communication efficiency in a whole of a communication network when assigning a data frame with an identifier to identify the frame and transmitting to a communication path.

It is a third object of the present disclosure to provide a data communication method and a data communication apparatus, which secure a high reliability while accelerating a data communication speed.

It is a fourth object of the present disclosure to provide a data communication method and a data communication apparatus, which can detect an error even in a control information portion of a communication frame.

To achieve the first object, according to a first example of the present disclosure, a coding apparatus is provided as follows. A data conversion device is included to perform a conversion of a 4-bit data having a 4-bit string into a 5-bit data pattern having a 5-bit string. A command conversion device is included to perform a conversion of a command into a 5N-bit command pattern having a 5N-bit string, wherein the N is a natural number that is two or more. An NRZI conversion device is included to perform a conversion of the 5-bit data pattern and the 5N-bit command pattern into NRZI codes, wherein the NRZI signifies No Return to Zero/Invert on ones. Herein, the data conversion device performs the conversion into the 5-bit data pattern having the 5-bit string in which (i) a number of bits of consecutive "0" data values is permitted to be maximum two, and, simultaneously, (ii) maximum one bit of head end two bits is permitted to have a "0" data value and maximum one bit of tail end two bits is permitted to have a "0" data value; and the command conversion device performs the conversion into the 5N-bit command pattern having the 5N-bit string in which a number of bits contained in consecutive "0" data values is permitted to be maximum two.

Under the above configuration, a command is converted into a 5N-bit command pattern that contains the maximum two consecutive "0" data values within a bit string of the 5N bits (10, 15, 20, . . . bits). Thus, command patterns after conversion can be easily expanded according to needed command classifications. Further, the bit string after the conversion into the NRZI code, the maximum consecutive length of bits whose data values are the same is maintained to be "3."

To achieve the second object, according to a second example of the present disclosure, a data communication method is provided for assigning a frame with an identifier to identify the frame and transmitting the frame to a communication path. The method includes: assigning a data frame, which has a highest communication frequency in a communication network, with an identifier that has a shortest identifier length, and transmitting the data frame with the identifier to the communication path; and assigning an arbitrary frame other than the data frame having the highest communication frequency with an identifier which has an arbitrary identifier length and transmitting the arbitrary frame to the communication path.

Under the above configuration, the identifier having the shortest length among the identifiers in the communication network follows the communication of the data frame having the highest communication frequency, thereby providing the highest communication frequency among the identifiers. This can beforehand prevent the communication frequency of a longer lengthened identifier from becoming higher than the communication frequency of a shorter lengthened identifier. This improves the communication efficiency of the communication network as the whole.

To achieve the third object, according to a third example of the present disclosure, a data communication method is provided to include: performing 4B5B coding of a link layer frame containing data; adding a preamble, a frame start portion, and a frame end portion to the link layer frame having undergone the 4B5B coding, generating a physical layer frame; performing an NRZI (Non Return to Zero Inversion) coding of the generated physical layer frame; performing, before transmitting the physical layer frame having undergone the NRZI coding as a transmission frame to the communication path, a bit error detection which determines whether a transmission data in the transmission frame is normal; performing, when receiving a physical layer frame as a reception frame from the communication path, a coding error detection that determines whether the 4B5B coding of the received physical layer frame is normal; performing a CRC (Cyclic Redundancy Check) error detection which determines whether data in a link layer frame included in the received physical layer frame is normal; performing a form error detection which determines whether a configuration and a content of the link layer frame are normal; performing a state error detection which determines whether an order of a bit string of the link layer frame is normal; and performing a timeout error detection which determines whether an ACK (ACKnowledgement) frame is normally received within a predetermined time.

The above configuration adopts a handshake communication method using an ACK frame for realizing non-collision; performs 4B5B coding of a link layer frame containing data; adds a preamble, a frame start portion, and frame start and tail ends to the link layer frame to generate a physical layer frame; and adds as a requirement for clock reproduction, an NRZI coding of the physical layer frame, thereby raising a communication speed. Moreover, when a reception frame is received from the communication path, the above configuration performs a bit error detection when a transmission frame is transmitted to a communication path, and performs a coding error detection, a CRC error detection, a form error detection, a state error detection, and a timeout error detection. Thereby, a high reliability can be secured.

To achieve the fourth object, according to a fourth example of the present disclosure, a data communication method for communicating a communication frame between a transmission side and a reception side is provided as follows. The communication frame contains (i) a control information portion that contains a control code, (ii) a data portion that contains a transmission data, and (iii) an error detection portion that contains an error detection code. The data communication method includes: transmitting, by the transmission side, the error detection portion that contains a control-use error detection code that is used for detecting an error in the control information portion; and performing, by the reception side, an error detection of the control information portion based on the control-use error detection code.

Therefore, the reception side can detect whether an error occurs also in the control information portion.

BRIEF DESCRIPTION OF THE DRAWINGS

The above and other objects, features, and advantages of the present disclosure will become more apparent from the following detailed description made with reference to the accompanying drawings. In the drawings:

FIG. 5 is a diagram illustrating a table of data values for expressing commands according to an example 2 of the first embodiment;

FIG. 10 is a diagram illustrating a communication frequency, an identifier length, and an identifier, of each frame according to the second embodiment;

FIG. 17 is a diagram illustrating an error classification, and a detection node according to the third embodiment;

FIG. 20 is a diagram illustrating a communication frequency, an identifier length, and an identifier, of each frame according to the example 1 of the fourth embodiment;

DETAILED DESCRIPTION

First Embodiment

Example 1

Figures 1A, 1B, 1C:
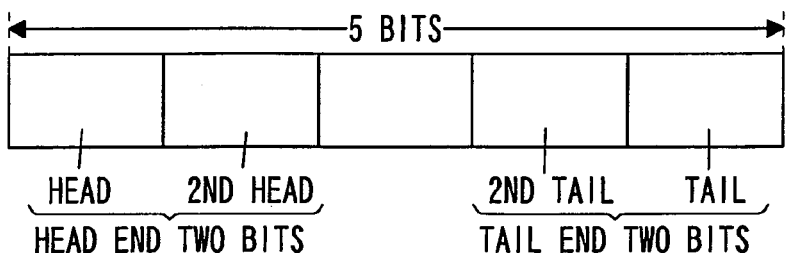
FIG. 1A is a diagram illustrating a table for converting a 4-bit data into a 5-bit data pattern according to an example 1 of a first embodiment.
FIG. 1B is a diagram illustrating a table of data values for expressing commands according to the example 1 of the first embodiment.
FIG. 1C is a diagram illustrating head end two bits and tail end two bits according to the example 1 of the first embodiment.

An example 1 of a first embodiment according to the present disclosure will be explained with reference to FIGS. 1A to 4. FIG. 3 is a functional block diagram illustrating a configuration of a coding apparatus that codes a transmission data and transmits the coded transmission data as a serial data. Here, a FIFO 2 (First In First Out, data/command identification device or means) 2 of the coding apparatus 1 receives a transmission signal (i.e., data or a command) outputted from a transmission control circuit (unshown); a signal going via the FIFO 2 is inputted into a 4B5B encoder 3 (data conversion device or means) and a 5N-bit command encoder 4 (command conversion device or means).

The data and the command inputted into the FIFO 2 are of nine (9) bits; the nine bits contain at a head an identification bit indicating a data using one bit of "0" and a command using one bit of "1." The identification bit is removed in the FIFO 2; thereby, a 8-bit string is outputted to the 4B5B encoder 3 and 5N bit command encoder 4. That is, the data and the command are inputted into the encoders 3, 4 without being indicated as the data or the command.

The 4B5B encoder 3 devices the inputted 8-bit data into a 4-bit data corresponding to the high order of the 8-bit data and a 4-bit data corresponding to the low order of the 8-bit data, and converts each 4-bit data into a 5-bit data or data pattern according to the table illustrated in FIG. 1A. In addition, the 5N-bit command encoder 4 converts the 8-bit command so as to be expressed using 10 bits (N=2, 5N=10). This conversion uses, out of the above 5-bit data patterns after the conversion by the 4B5B encoder 3, (i) the (xxxx1) data pattern whose tail data value is "1" and (ii) the (1xxxx) data pattern whose head data value is "1"; thereby, (i) the (xxxx1) data pattern and (ii) the (1xxxx) data pattern are combined with one of seven command patterns (1) to (7) for expressing a single command.

The data after the conversion by the 4B5B encoder 3 and the command after the conversion by 5N bit command encoder 4 are provided to a serializer 6 via a selector 5 (selection device or means) for undergoing a parallel/serial conversion. A serial data after the conversion is converted into an NRZI code by an NRZI encoder 7 (NRZI signal conversion device or means), and transmitted from a transmission terminal. It is noted that the FIFO 2 determines whether the bit string under the processing is a data or a command according to the value of the identification bit, and outputs a data/command identification signal (selection switch signal) to the selector 5.

Figure 4:
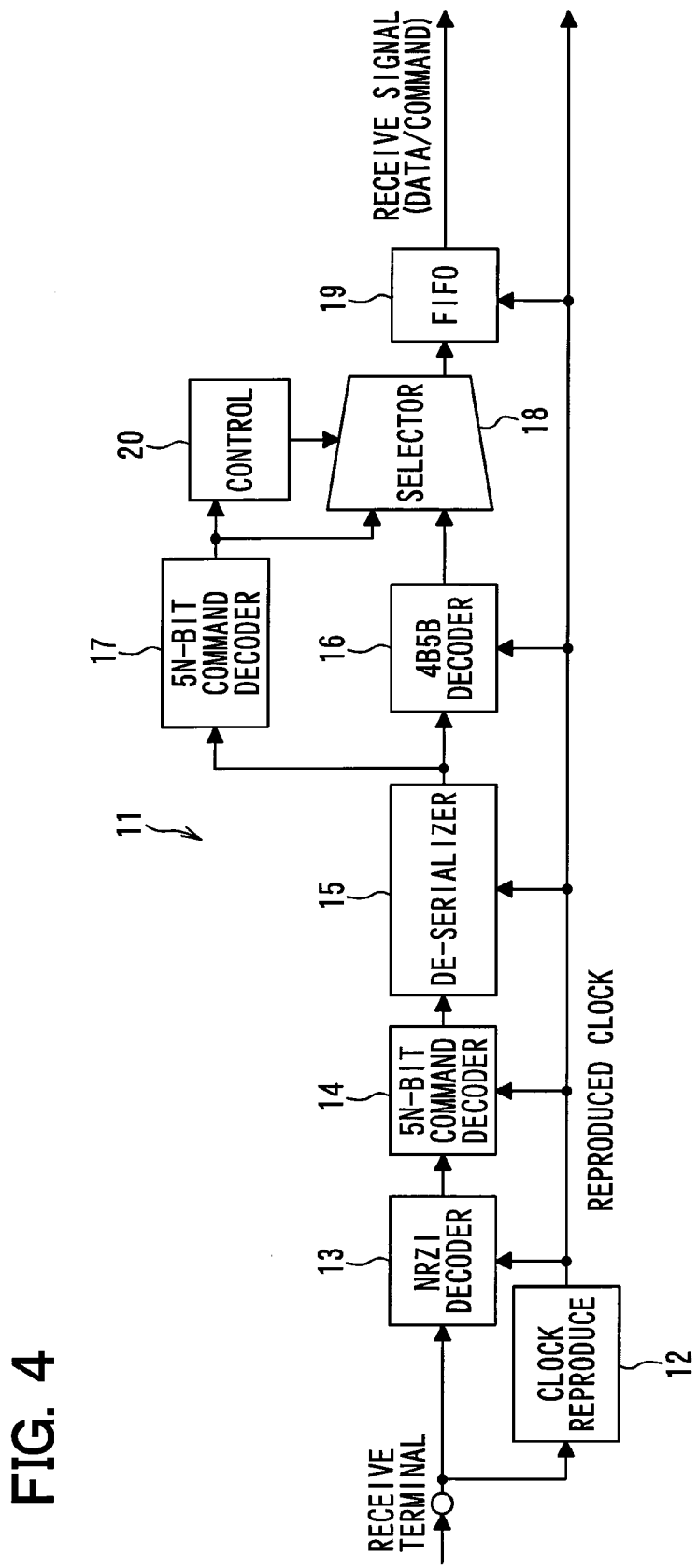
FIG. 4 is a functional block diagram illustrating a configuration of a decoding apparatus according to the example 1 of the first embodiment.

FIG. 4 is a functional block diagram illustrating a configuration of a decoding apparatus 11 which receives the data and command via the coding apparatus 1, and decodes the data and the command. The reception signal is inputted into a clock reproduction portion 12 and an NRZI decoder 13. The clock reproduction portion 12 extracts a clock component from the received bit string of the NRZI code, and supplies a reproduced clock signal to each function portion. The NRZI decoder 13 converts (decodes) the received NRZI code into the data and the command of 5 bits or 5N bits and outputs them to a 5N-bit command decoder 14.

Figure 2:
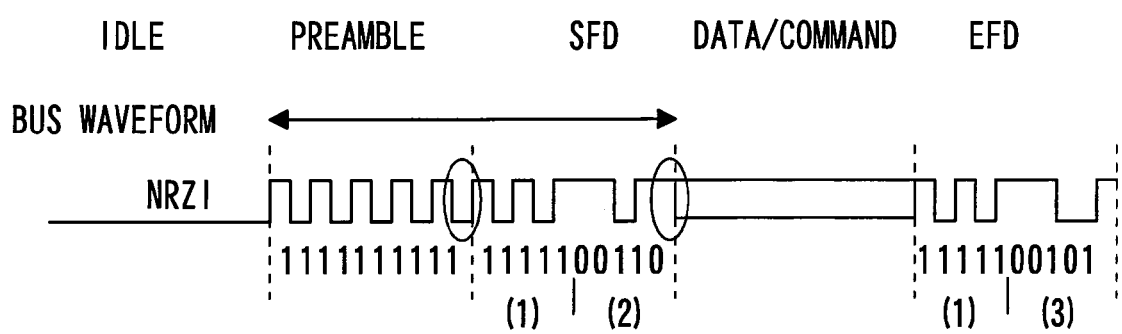
FIG. 2 is a diagram illustrating a waveform transmitted using NRZI code according to the example 1 of the first embodiment.
Figure 3:
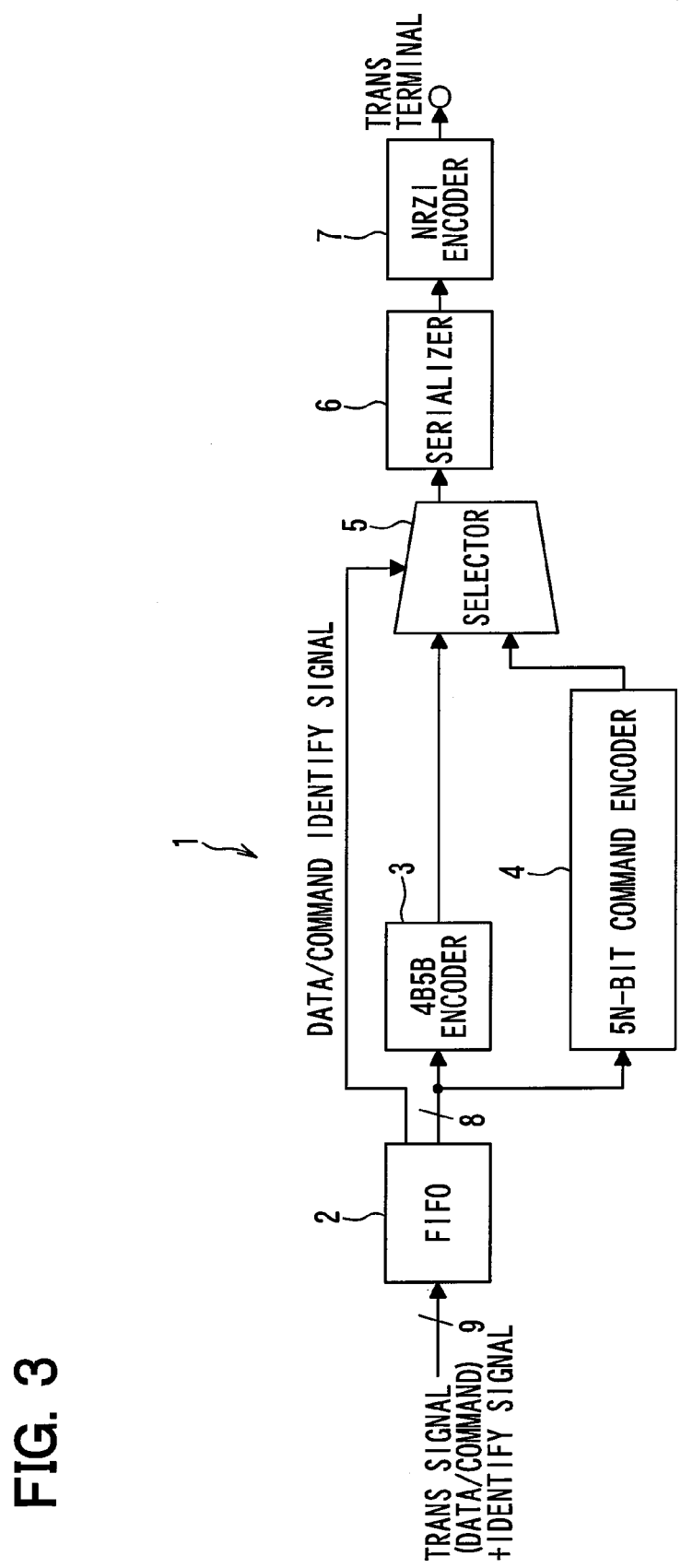
FIG. 3 is a functional block diagram illustrating a configuration of a coding apparatus according to the example 1 of the first embodiment.

The frame of a transmission data in the present embodiment is illustrated in FIG. 2. The transmission data contains (i) a preamble that is a command for synchronization at the beginning, (ii) a command SFD (Start of Frame Delimiter) for detecting the head of the frame, (iii) a data or a command, and (iv) a command EFD (End of Frame Delimiter) for finally detecting the tail or end of the frame. The 5N-bit command decoder 14 detects (i.e., decodes) the command SFD. When detecting the command SFD, the 5N-bit command decoder 14 outputs the subsequent reception data or command to a de-serializer 15.

The de-serializer 15 applies a serial/parallel conversion to every 5 bits of the received bit string and outputs them to a 4B5B decoder 16 and a 5N-bit command decoder 17. The 4B5B decoder 16 applies an inverse conversion to the received 5-bit data or data pattern to generate a 4-bit data according to the table illustrated in FIG. 1A. Further, the 4-bit data corresponding to the high order and the 4-bit data corresponding to the low order are combined into a 8-bit data. In addition, the 5N-bit command decoder 17 applies an inverse conversion to the 5N-bit command to generate a 8-bit command pattern.

The 8-bit data after the inverse conversion by the 4B5B decoder 16 and the command after the inverse conversion by the 5N bit command decoder 17 are outputted to a FIFO 19 via a selector 18. The command after the inverse conversion by the 5N bit command decoder 17 is given to a control circuit 20. The control circuit 20 determines whether the bit string under the present processing is a data or a command and outputs a switch control signal to the selector 18 based on the determination result.

The following will explain patterns of the data and the command after the conversion by the 4B5B encoder 3 and the 5N-bit command encoder 4, respectively, with reference to FIGS. 1A, 1B, 1C. FIG. 1C is a diagram illustrating head end two bits and tail end two bits of a 5-bit string. First, a 5-bit data or data pattern after the conversion from a 4-bit data is provided with the following conditions about the arrangement of the data value "0" (also referred to as "0" data value).

(1) Maximum one bit having "0" data value is arranged on the MSB side or the LSB side (i.e., in the head end two bits or in the tail end two bits).

(2) Maximum two consecutive bits having "0" data values are arranged in the whole of a bit string of the 5-bit data. Under both the conditions being simultaneously satisfied, the number of bits having the consecutive "0" data values is limited to maximum two even when any two 5-bit data patterns are combined in series.

In addition, unlike the above 5-bit data, the command is expressed by using command patterns (1) to (7) that are selected on the condition that the number of the bits included in the consecutive "0" data values is maximum two. Further, with reference to FIG. 1B, the commands are expressed as 10-bit data (N=2) by combining, out of the above 5-bit data patterns, the ten (xxxx1) data pattern whose tail bit is "1" or the (1xxxx) ten data whose head bit is "1", with the command patterns (1) to (7). For instance, the first half 5 bits is assigned with the (xxxx1) data pattern and the command pattern (1), achieving eleven classifications: the second half 5 bits is assigned with the command patterns (2) to (4), achieving 3 classifications. Thus, 11×3=33 classifications of the commands can be assigned.

Further, the first half 5 bits is assigned with the command patterns (5) to (7), achieving 3 classifications; the second half 5 bits is assigned with the (1xxxx) data pattern and the command pattern (1), achieving eleven classifications. Thus, similarly, 11×3=33 classifications of the commands can be assigned. Thus, the total of 66 command classifications can be assigned. (Therefore, the total of 66 command classifications of 8-bit commands before the conversion are provided.) The command patterns (2) to (7) are permitted to have maximum two consecutive "0" data values at the MSB side or and LSB side (i.e., in the head end two bits or in the tail end two bits); the command patterns (2) to (7) are combined with the command pattern (1), the (xxxx1) data pattern or (1xxxx) data pattern. As a result, when these are combined, the consecutive "0" data values are limited to maximum 2 bits.

Further, as illustrated in FIG. 2, the preamble contains 10 bits whose all the data values are "1s" (i.e., command pattern (1)/(1)); the command SFD contains "1111100110" (i.e., command pattern (1)/(2)); and the command EFD contains "1111100101" (i.e., command pattern (1)/(3)). Here, consider the consecutive 20 bits combining serially the preamble and the command SFD. Even when any arbitrary consecutive 10 bits other than the consecutive bits of the command SFD are selected from a bit string of the 20 bits, the selected arbitrary consecutive 10 bits do not have the same bit pattern as that of the command SFD. In addition, see the data waveform that is coded into NRZI in FIG. 2. The final bit waveform (i.e., sign) "1" of the preamble is different from (i.e., is inverse) the final bit waveform "0" of the command SFD (see two encircled parts in FIG. 2). Thereby, the reception side can certainly distinguish between the preamble and the command SFD.

According to the present embodiment, the 4B5B encoder 3 converts the inputted 4-bit data into a pattern of a 5-bit data that contains maximum one bit of data value "0" at the head end two bits and maximum one bit of data value "0" at the tail end two bits, and maximum two consecutive bits of data values "0s" in the whole of the 5-bit data pattern. In other words, the two consecutive "0s" do not appear in the head end two bits and in the tail end two bits within the 5-bit data. The 5N-bit command encoder 4 converts the command into the command pattern that contains the maximum two consecutive data values "0s" within the bit string of the 5N bits. Further, the data and the command after the above conversions are converted into the NRZI code by the NRZI encoder 7. That is, the command is converted into the command pattern that contains the maximum two consecutive data values "0s" within the bit string of the 5N bits; thus, command patterns after conversion can be easily expanded according to needed command classifications. Further, the bit string after the conversion into the NRZI code contains the consecutive bit length of the bits whose data values are the same is maintained to be maximum "3."

In addition, the 4B5B encoder 3 performs the conversion as follows. (i) The preamble for the communication synchronization use command and the frame start command SFD are serially arranged; (ii) the bit string or pattern serially combining both the commands do not contain, other than the command SFD itself, the same command pattern as the command SFD, and (iii) the sign of the final bit of the command SFD after the conversion by the NRZI encoder 7 is different from (i.e., is inverse) the sign of the final bit of the preamble, in the bit string or pattern serially combining both the commands. In specific, when N=2 is set, the pattern of the preamble is converted into "1111111111"; the pattern of the command SFD is converted into "1111100110." Therefore, the reception side can distinguish between the terminating end point of the preamble and the terminating end point of the command SFD clearly; the erroneous decision can be prevented. In addition, each of the data and the command before conversion is assigned with an identification bit for identifying either the data or the command. The FIFO 2 refers to the identification bit, thereby outputting a selection switch signal to the selector 5. The data after the conversion and the command after the conversion are selectively outputted. Therefore, the data and the command that are provided in a predetermined order can be converted and outputted in a suitable order.

Example 2

FIG. 5 illustrates an example 2 of the first embodiment. The same devices or the like as those of the example 1 are assigned with the same reference numbers. Explanation is made mainly for different parts and omitted for the same devices or the like. The configuration of the example 2 is basically the same as that of the example 1, but different from the example 1 in the coding process of the 5N-bit command encoder 4 and the decoding process of the 5N-bit command decoder 17 of the coding apparatus 1. FIG. 5 is a diagram corresponding to FIG. 1A or 1B. The example 1 uses some of 5-bit data patterns when converting the command into 5N bits. In contrast, the example 2 expresses the commands by combining the command patterns (1)-(7) in the example 1 without using 5-bit data patterns. However, in the case of N=2, the example 2 can provide only seven command classifications.

As illustrated in FIG. 1B, commands No. 1 to 7 are expressed by the combination of the following patterns. The command No. 1 contains the command pattern (1) at the first half 5-bits and the command pattern (1) at the second half 5-bits. The command No. 2 contains the command pattern (1) at the first half 5-bits and the command pattern (2) at the second half 5-bits. The command No. 3 contains the command pattern (1) at the first half 5-bits and the command pattern (3) at the second half 5-bits. The command No. 4 contains the command pattern (1) at the first half 5-bits and the command pattern (4) at the second half 5-bits. The command No. 5 contains the command pattern (5) at the first half 5-bits and the command pattern (1) at the second half 5-bits. The command No. 6 contains the command pattern (6) at the first half 5-bits and the command pattern (1) at the second half 5-bits. The command No. 7 contains the command pattern (7) at the first half 5-bits and the command pattern (1) at the second half 5-bits. Here, the commands No. 1 to 3 correspond to the preamble, SFD, and EFD, respectively; thus, other four commands No. 4 to 7 are permitted to be used for commands other than the preamble, SFD, and EFD.

In addition, the 4B5B encoder 3 performs the conversion so as not to overlap each 5-bit string in the 5N-bit command pattern with the pattern of the 5-bit data. The reception side that receives the data and the command after the conversion can thus distinguish between the data and the command when receiving the first 5 bits.

Example 3

Figure 6:
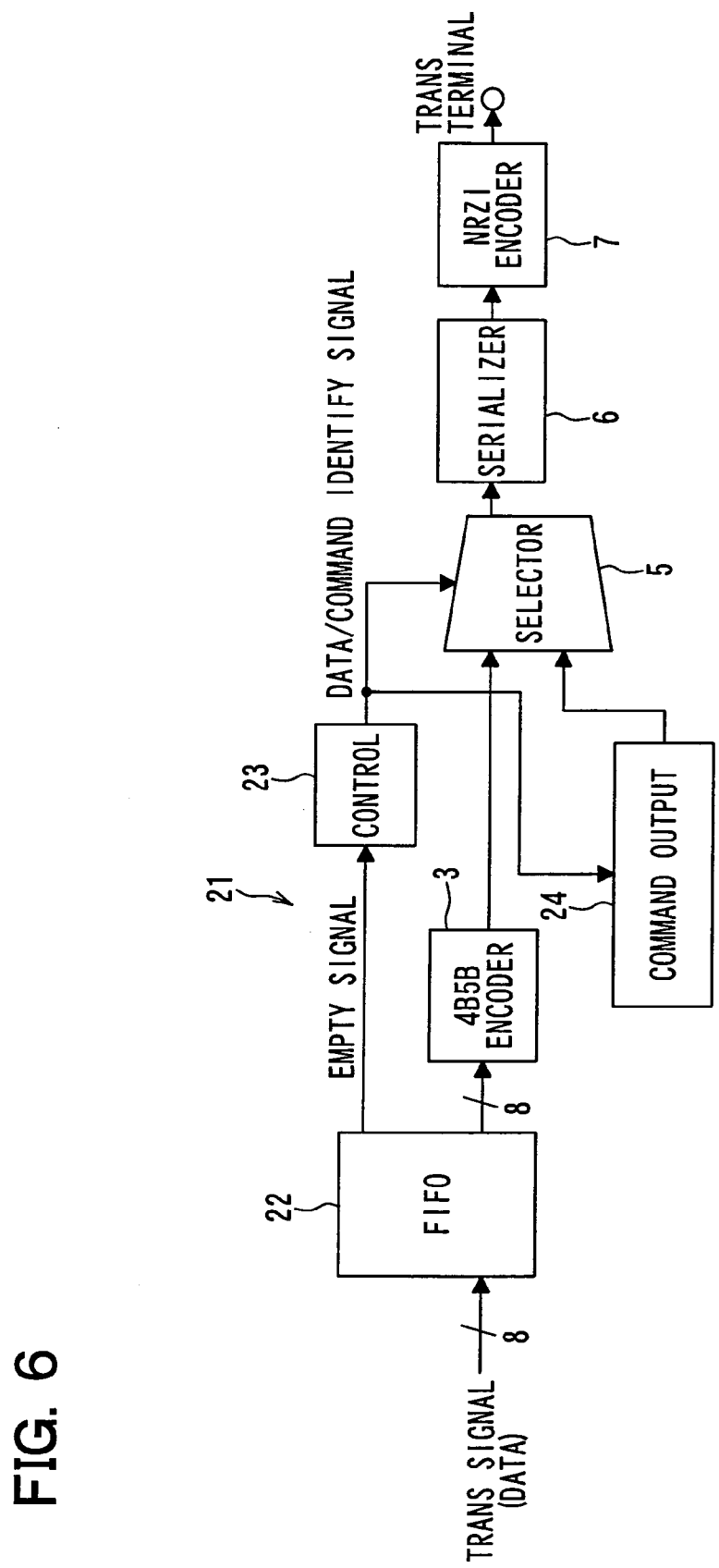
FIG. 6 is a functional block diagram illustrating a configuration of a coding apparatus according to an example 3 of the first embodiment.

FIG. 6 indicates a configuration of the coding apparatus 21 according to an example 3. Only a different portion from the example 1 is explained. The coding apparatus 21 of the example 3 replaces the FIFO 2 with a FIFO 22 that is a little different from the FIFO 2. The FIFO 22 is not provided with any command and provided with only 8-bit data (therefore, any identification bit is unnecessary). The FIFO 22 transmits an EMPTY signal (data detection signal) to a control circuit 23 (also referred to as a command conversion device or means). The FIFO 22 makes the EMPTY signal active when no data is inputted, and makes the EMPTY signal inactive (NO EMPTY) when any data is inputted. Thus, the FIFO 22 may be referred to as a data detection device or means.

In addition, the 5N-bit command encoder 4 is replaced with a command output portion 24 (also referred to as a command conversion device or means). Suppose that the example 3 uses only three commands of the preamble, SFD, and EFD. These three commands are previously converted into the 10-bit command patterns like the examples 1, 2, and outputted to the selector 5 in an order of the preamble, the SFD, and the EFD, based on time point of a signal provided by the control circuit 23.

The control circuit 23 outputs the data/command identification signal to the selector 5 and the command output portion 24, according to the change of the EMPTY signal. The control circuit 23 switches the selector 5 to the side of the command output portion 24 at a trigger time when the EMPTY signal changes from active to inactive. The command output portion 24 outputs the preamble and SFD in series. The control circuit 23 switches the selector 5 to the side of the 4B5B encoder 3 after an elapsed time that is necessary for transmitting 20 bits from when the selector 5 is switched to the side of the command output portion 24, and causes the selector 5 to output the 5-bit data. The selector 5 is again switched to the side of the command output portion 24 after an elapsed time that is necessary for transmitting bytes predetermined in communication format. At this time, the command output portion 24 outputs the command EFD.

According to the example 3, the command output portion 24 outputs the 5N-bit command patterns, which have previously undergone the conversion, in a predetermined order based on a time point of the change of the EMPTY signal. The selector 5 selectively outputs (i) the data after the conversion and (ii) the command after the conversion, based on the change of the EMPTY signal. That is, the order of the command and the data is predetermined within a transmission frame in the data communication; thus, the command only needs to be outputted as the 5-bit command pattern at a suitable time point according to the data transmission state. Then, the selector 5 selectively outputs (i) the data after the conversion and (ii) the command after the conversion, based on the change of the EMPTY signal; thereby, the conversion result can be outputted according to the predetermined format. Therefore, the command does not need to be converted in real time.

Example 4

Figure 7:
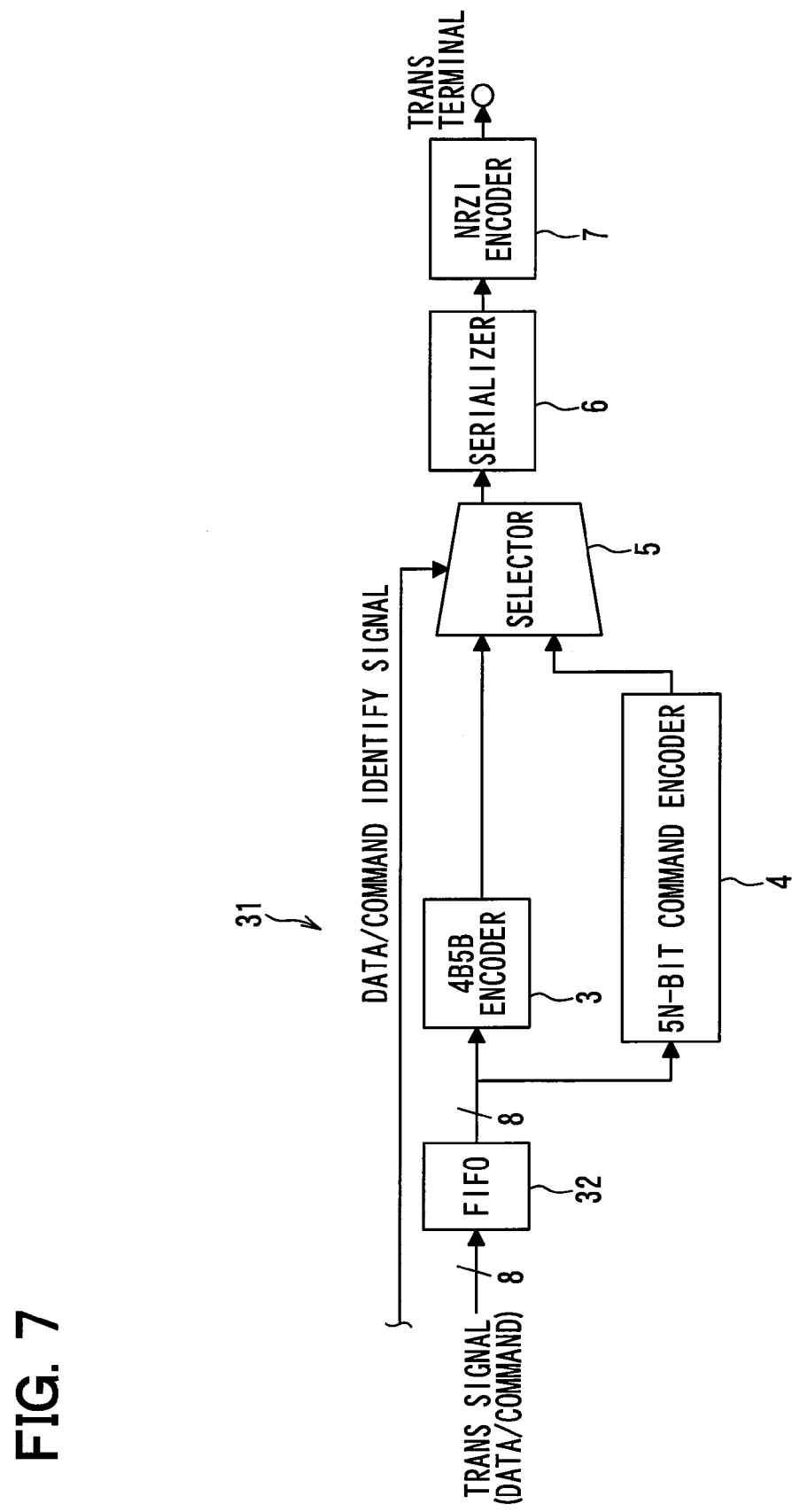
FIG. 7 is a functional block diagram illustrating a configuration of a coding apparatus according to an example 4 of the first embodiment.

FIG. 7 illustrate a configuration of a coding apparatus 31 according to an example 4. Explanation for the example 4 is made only for a part different from the example 1 of the first embodiment. The coding apparatus 31 of the example 4 does not use any identification bit; a FIFO 32 is provided with data and commands of 8-bit data. The FIFO 32 has no identifying function for the data/command, unlike the FIFO 2 of the example 1; the FIFO 32 includes a general FIFO. In the example 4, a transmission control portion (unshown) outputs a data/command identification signal to the selector 5. That is, the transmission control portion can recognize (i) the time point when the transmission control portion itself outputs the data and the command, and (ii) the time point when the coding apparatus 31 executes the conversion process, thereby outputting a data/command identification signal based on the result of the recognition. The example 4 can simplify a configuration of the coding apparatus 31.

The present disclosure is not limited only to the above-mentioned or drawing-illustrating embodiment, and can be modified or extended as follows. Any one of the coding of the data and the coding of the command may take place earlier than the other. The preamble and the command SFD do not need to be converted into "1111111111" and "1111100110", respectively. That is, the minimum requirement for the pattern serially combining both the commands is as follows: the conversion is made under the condition (i) that another same command pattern as the command SFD is not contained, and the condition (ii) that the sign of the final bit of the preamble after the conversion into the NRZI code is different from the sign of the final bit of the command SFD after the conversion into the NRZI code. In addition, one or both of the above two conditions (i) and (ii) may be removed from the requirement when there is no trouble in the distinction by the reception side.

In addition, of course, the first embodiment may apply to a data transmission system which uses neither a command for communication synchronization, nor a frame start command. The EMPTY signal of the example 3 may be replaced with an NO_EMPTY signal which is switched into active when the data is written in the FIFO 32. The command or command pattern may be expanded to be N≥3 according to the number of necessary command classifications.

Second Embodiment

Figure 8:
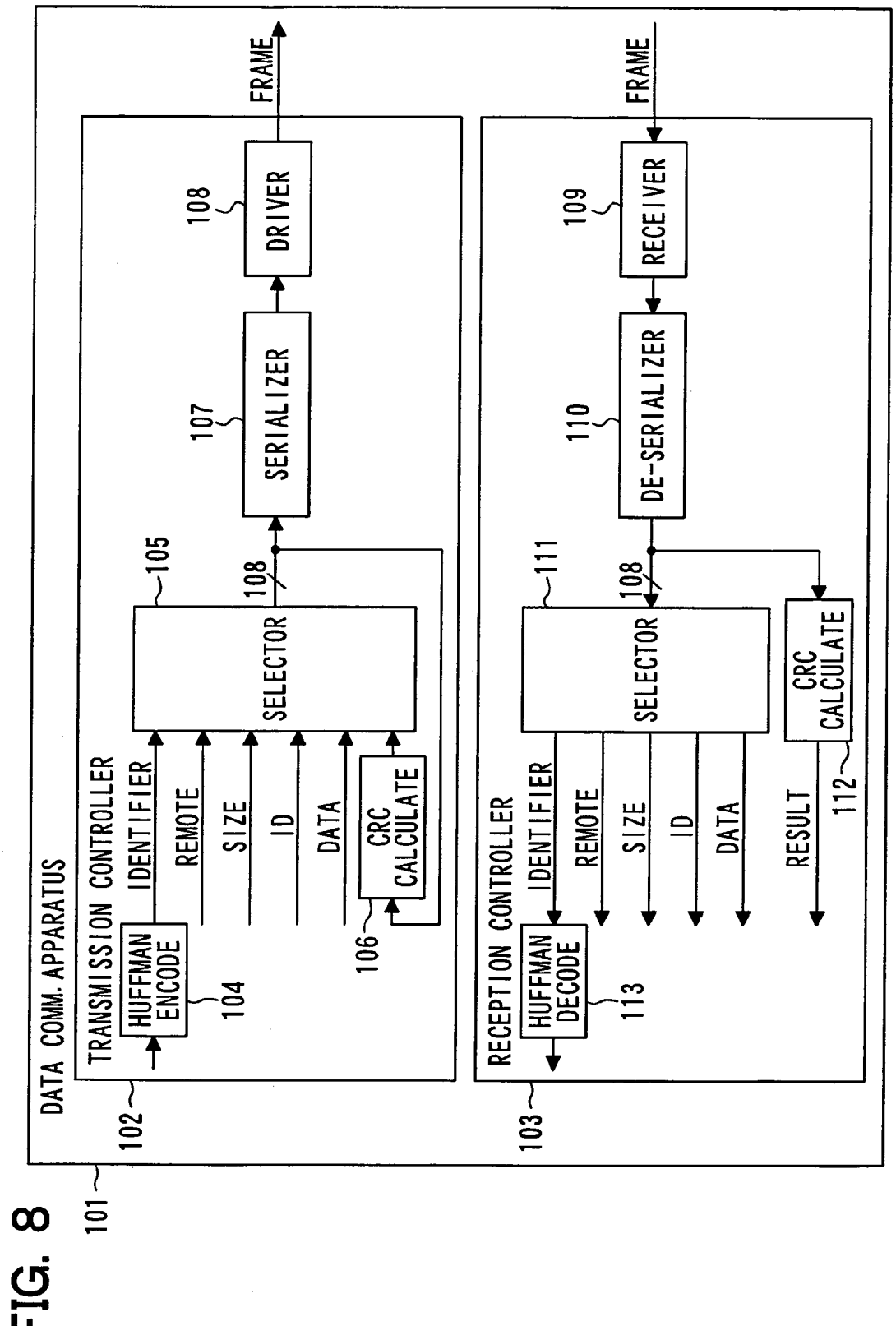
FIG. 8 is a functional block diagram illustrating a configuration of a data communication apparatus according to a second embodiment of the present disclosure.

FIG. 8 is a functional block diagram illustrating a configuration of a data communication apparatus according to a second embodiment of the present disclosure. The data communication apparatus 101 includes a transmission controller 102 which controls a data transmission system, and a reception controller 103 which controls a data reception system.

The transmission controller 102 includes a Huffman encoding portion 104, a selector 105 (also referred to as an identifier assignment device or means), a CRC (Cyclic Redundancy Check) calculation portion 106, a serializer 107, and a driver 108 (also referred to as a transmission device or means). The Huffman encoding portion 4 outputs an identifier which contains Huffman coding to the selector 105. The selector 105 receives the following bit strings: a bit string that indicates an identifier, a bit string that indicates a remote which indicates a data write or a data read, a bit string that indicates a size which indicates a data length, a bit string that indicates an address space to access, a bit string that indicates a data, and a bit string that indicates a CRC outputted from the CRC calculation portion 106. The selector 105 assembles the received bit strings, thereby generating frames including a data frame, a burst frame, an ACK (Acknowledge) frame, and a command frame. The generated frames are outputted to the serializer 107.

The serializer 107 receives the frames in bit strings in units of 8-bits and applies a parallel/serial conversion to the received frames and outputs the frames after having undergone the parallel/serial conversion to the driver 108. When receiving the frames having undergone the parallel/serial conversion from the serializer 107, the driver 108 transmits the received frames to a communication path.

The reception controller 104 includes a receiver 109, a de-serializer 110, a selector 111, a CRC calculation portion 112, and a Huffman decoding portion 113. When receiving the frames from the communication path, the receiver 109 outputs the received frames to the de-serializer 110. When receiving the frames from the receiver 109, the de-serializer 110 applies a serial/parallel conversion to the received frames, and output the frames after having undergone the serial/parallel conversion to the selector 111 and the CRC calculation portion 112. When receiving the bit strings in units of 8 bits having undergone the serial/parallel conversion from the de-serializer 110, the selector 111 extracts, from the received 8-bit unit bit strings, a bit string that indicates an identifier, a bit string that indicates a remote, a bit string that indicates a size, a bit string that indicates an ID (IDentification), and a bit string that indicates a data. When receiving the 8-bit unit bit strings having undergone the serial/parallel conversion from the de-serializer 110, the CRC calculation portion 112 performs an error determination to the received 8-bit unit bit strings using a computing equation, and outputs a result of the error determination.

The data communication apparatus 101 determines an identifier length that is the number of bits of an identifier assigned to each frame as follows. The following will explain a procedure to determine the bit number of the identifier assigned to each frame with reference to FIG. 9 and FIG. 10. Further, the following will explain on a premise that (i) a frame having the highest communication frequency (use frequency) in a communication network is a data frame that has an ID length of the predetermined number of bits, (ii) a frame having the second highest communication frequency is an ACK frame, and (iii) a frame having the third highest communication frequency is a command frame. It is noted that the data communication apparatus 101 is supposed to be used in a communication system such as an in-vehicle communication network (i.e., in-vehicle LAN (Local Area Network)) mounted in a vehicle, for example. Such an in-vehicle communication network has a severe noise environment; thus, the communication failure occurs frequently. As a result, the communication frequency of the ACK frame is supposed to be the second highest.

First, a data frame is determined which has the highest communication frequency in the communication network. In detail, Na is defined as the number of nodes (chips) connected to the communication path; Nb is defined as an address space required for the nodes; N, N1, N2 are coefficients. N1 is obtained to satisfy Na≤2N1. N2 is obtained to satisfy Nb=2N2. N is obtained to be N1+N2. In the communications system according to present embodiment, it is assumed to be Na≤8. N1=3 can be thus obtained. When it is assumed to be N2=9, N=12 is obtained. Thus, the data frame which has the ID length of N bits (i.e., 12 bits) is determined to be a data frame which has the highest communication frequency in the communication network.

Figure 9:
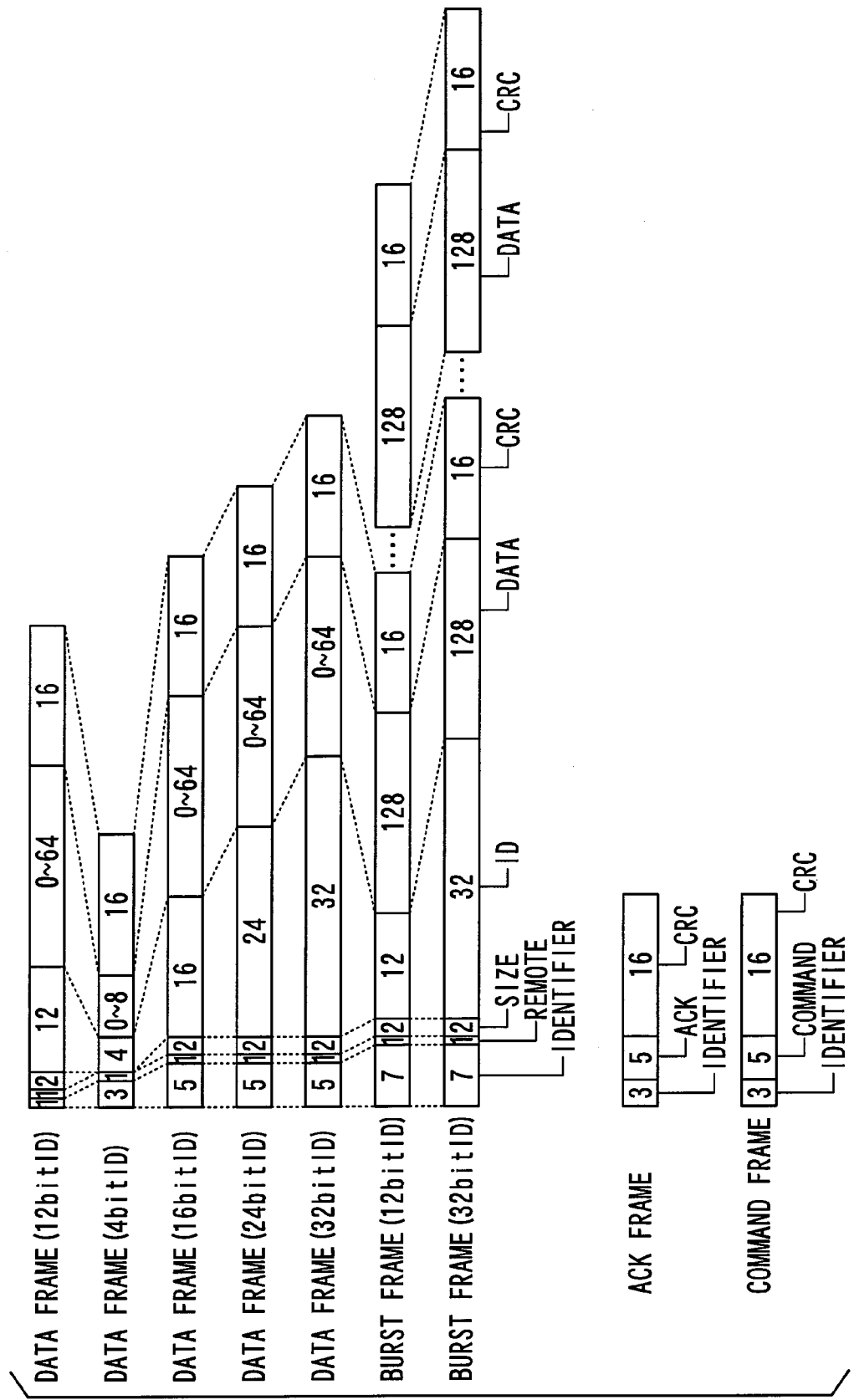
FIG. 9 is a diagram illustrating a frame structure of each frame according to the second embodiment.

Next, in the above-determined data frame having the ID length of 12 bits, the bit number of bits of the remote (remote length), the bit number of bits of the size (size length), the bit number of bits of the ID (ID length) are specified. The bit number of bits of the identifier (identifier length) is determined such that the bits of the total sum of the identifier length, the remote length, the size length, and the ID length is a multiple of 8 (8N, i.e., 8 bits, 16 bits, 24 bits, 32 bits, . . . ). That is, as illustrated in FIG. 9, the data frame which has an ID length of 12 bits has a remote length of 1 bit, a size length of 2 bit, an ID length of 12 bits. The bit number of bits of the identifier (identifier length) is determined to be 1 bit such that the bits of the total sum of the identifier length, the remote length, the size length, and the ID length is the closest multiple of 8 (i.e., 16 bits). In detail, the identifier assigned to the data frame having an ID length of 12 bits is determined to be "0", as illustrated in FIG. 10.

Next, the bit number of the identifier is determined for assigning to the ACK frame having the second highest communication frequency next to the data frame having an ID length of 12 bits. The ACK indicates a response to a request. That is, as illustrated in FIG. 9, the ACK frame has the ACK length of 5 bits, and the CRC length of 16 bits. The number of bits of the identifier (identifier length) is determined to be 3 bits such that the bits of the total sum of the ACK length, the CRC length, and the identifier length is the closest multiple of 8 (i.e., 24 bits). In detail, the identifier assigned to the ACK frame is determined to be "100", as illustrated in FIG. 10.

Next, the bit number of the identifier is determined for assigning to the command frame having the third highest communication frequency next to the data frame having an ID length of 12 bits and the ACK frame. The command indicates control information. That is, as illustrated in FIG. 9, the command frame contains the command length of 5 bits and the CRC length of 16 bits. The number of bits of the identifier (identifier length) is determined to be 3 bits such that the bits of the total sum of the command length, the CRC length, and the identifier length is the closest multiple of 8 (i.e., 24 bits). In detail, the identifier assigned to the command frame is determined to be "101", as illustrated in FIG. 10.

Moreover, expansion use data frames that are unnecessary at the present system may be required in future expansion of the communication system such as the increase of the address space or the communication of data having longer data length. The data communication apparatus 101 determines an identifier length that is the bit number of bits of an identifier assigned to the expansion use data frames as follows. The following is on a premised that the expansion use data frames include a data frame that has an ID length of 4 bits, a data frame that has an ID length of 16 bits, a data frame that has an ID length of 24 bits, and a data frame that has an ID length of 32 bits.

As illustrated in FIG. 9, the expansion use data frame which has an ID length of 4 bits has a remote length of 1 bit, a size length of 0 bit, an ID length of 4 bits. The bit number of bits of the identifier (identifier length) is determined to be 3 bits such that the bits of the total sum of the identifier length, the remote length, the size length, and the ID length is the closest multiple of 8 (i.e., 8 bits). In detail, the identifier assigned to the expansion use data frame having an ID length of 4 bits is determined to be "110", as illustrated in FIG. 10.

As illustrated in FIG. 9, the data frame which has an ID length of 16 bits has a remote length of 1 bit, a size length of 2 bits, an ID length of 16 bits. The bit number of bits of the identifier (identifier length) is determined to be 5 bits such that the bits of the total sum of the identifier length, the remote length, the size length, and the ID length is the closest multiple of 8 (i.e., 24 bits). In detail, the identifier assigned to the expansion use data frame having an ID length of 16 bits is determined to be "11100", as illustrated in FIG. 10.

As illustrated in FIG. 9, the data frame which has an ID length of 24 bits has a remote length of 1 bit, a size length of 2 bits, an ID length of 24 bits. The bit number of bits of the identifier (identifier length) is determined to be 5 bits such that the bits of the total sum of the identifier length, the remote length, the size length, and the ID length is the closest multiple of 8 (i.e., 32 bits). In detail, the identifier assigned to the expansion use data frame having an ID length of 24 bits is determined to be "11101", as illustrated in FIG. 10.

As illustrated in FIG. 9, the data frame which has an ID length of 32 bits has a remote length of 1 bit, a size length of 2 bits, an ID length of 32 bits. The bit number of bits of the identifier (identifier length) is determined to be 5 bits such that the bits of the total sum of the identifier length, the remote length, the size length, and the ID length is the closest multiple of 8 (i.e., 40 bits). In detail, the identifier assigned to the expansion use data frame having an ID length of 32 bits is determined to be "11110", as illustrated in FIG. 10.

Further, a burst frame contains several data (i.e., several data elements) and several CRCs. The bit number of the identifier of the burst frame is arbitrarily determined, unlike the above-mentioned data frame of which the bit number of bits of the identifier (identifier length) is determined such that the bits of the total sum of the identifier length, the remote length, the size length, and the ID length is a closest multiple of 8. That is, as illustrated in FIG. 9, while the burst frame which has an ID length of 12 bits has a remote length of 1 bit, a size length of 2 bits, and an ID length of 12 bits, the bit number of the identifier is determined to be 7 bits, for instance. In detail, the identifier assigned to the burst frame having an ID length of 12 bits is determined to be "1111100", as illustrated in FIG. 10.

Further, as illustrated in FIG. 9, while the burst frame which has an ID length of 32 bits has a remote length of 1 bit, a size length of 2 bits, an ID length of 32 bits, the bit number of the identifier is determined to be 7 bits, for instance. In detail, the identifier assigned to the burst frame having an ID length of 32 bits is determined to be "1111101", as illustrated in FIG. 10.

In the above-mentioned configuration, the data frame of an ID length of 12 bits having the highest communication frequency is assigned with an identifier which has the shortest identifier length (1 bit). The ACK frame having the second highest communication frequency and the command frame having the third highest communication frequency are assigned with identifiers which have the second shortest identifier length (3 bits). The expansion use data frames and the burst frame are assigned with one of (i) an identifier which has the second shortest identifier length (3 bits), (ii) an identifier which has the third shortest identifier length (5 bits), and (iii) an identifier which has the fourth shortest identifier length (7 bits).

Further, with respect to the burst frame, the bit number of the identifier is determined arbitrarily. In this regard, however, like the above-mentioned data frame, even with respect to the burst frame, the bit number of bits of the identifier (identifier length) may be determined such that the bits of the total sum of the identifier length, the remote length, the size length, and the ID length is a closest multiple of 8. Each of the burst frame which has an ID length of 32 bits and the burst frame which has an ID length of 12 bits may be assigned with an identifier having the bit number of 5 bits.

As explained above, the present embodiment provides a configuration as follows. When a data frame having the highest communication frequency in a communication network is a data frame that has an ID length of 12 bits, the data frame having the ID length of 12 bits is assigned with an identifier which has the shortest identifier length of 1 bit and transmitted to a communication path. In contrast, an arbitrary frame other than the data frame having the ID length of 12 bits is assigned with an identifier which has an arbitrary identifier length and transmitted to a communication path. Therefore, a 1-bit identifier having the shortest length among the identifiers in the communication network follows the communication of the data frame which has an ID length of 12 bits in the communication network; thus, the 1-bit identifier provides the highest communication frequency among the identifiers. That is, this configuration can prevent the communication frequency of the longer lengthened identifier from being higher than the communication frequency of the shorter lengthened identifier. This improves the communication efficiency of the communication network as the whole.

Further, Na is defined as the node number of nodes connected to the communication path. Nb is defined as an address space required for the nodes. N, N1, N2 are coefficients. N1 is obtained to satisfy Na≤2N1. N2 is obtained to satisfy Nb=2N2. N is obtained to be N1+N2. The data frame which has an ID length of N bits is determined to be a data frame with the highest communication frequency. Thus, the data frame of a target assigned with an identifier which has the shortest identifier length is determined based on the node number of nodes connected with the communication path and the required address space.

Moreover, the ACK frame is assigned with an identifier of the second shortest identifier length of 3 bits and transmitted to the communication path. This improves the communication efficiency of the communication network as the whole in the communication system such as a handshake communication method where the communication frequency of the ACK frame serving as a reply to the data frame is the second highest next to the data frame.

Moreover, the command frame is also assigned with an identifier of the second shortest identifier length of 3 bits and transmitted to the communication path. This improves the communication efficiency of the communication network as the whole in the communication system where the communication frequency of the command frame used for exchanging control signals (commands) is the third highest next to the data frame and the ACK frame.

Moreover, the expansion use data frames having ID lengths of 4 bits, 16 bits, 24 bits, and 32 bits are assigned, in an ascending order of frame lengths, with an identifier having the second shortest 3-bit identifier length, an identifier having the third shortest 5-bit identifier length, and an identifier having the fourth shortest 7-bit identifier, and transmitted to the communication path. Further, the expansion use data frame is used as a measure to the address space that is unnecessary in the present system but increasing in the future system and a measure to communicate data having a longer data length. The identifier which has a shorter identifier length is assigned, in order, to a shorter expansion use data frame. Moreover, it is assumed that the demand of the expansion use data frames increases gradually (step by step). Assigning an identifier which has a shorter identifier length to a shorter data frame in order can beforehand prevent the standard from flooding.

The present disclosure is not limited only to the above-mentioned embodiment, and can be modified or extended as follows. The above embodiment may apply to the communication system in which the frame having the highest communication frequency is a data frame having a ID length other than the data frame having a 12-bit length. Further, the above embodiment may apply to the communication system in which the frame having the second highest communication frequency is the command frame instead of the ACK frame.

Third Embodiment

Figure 11:
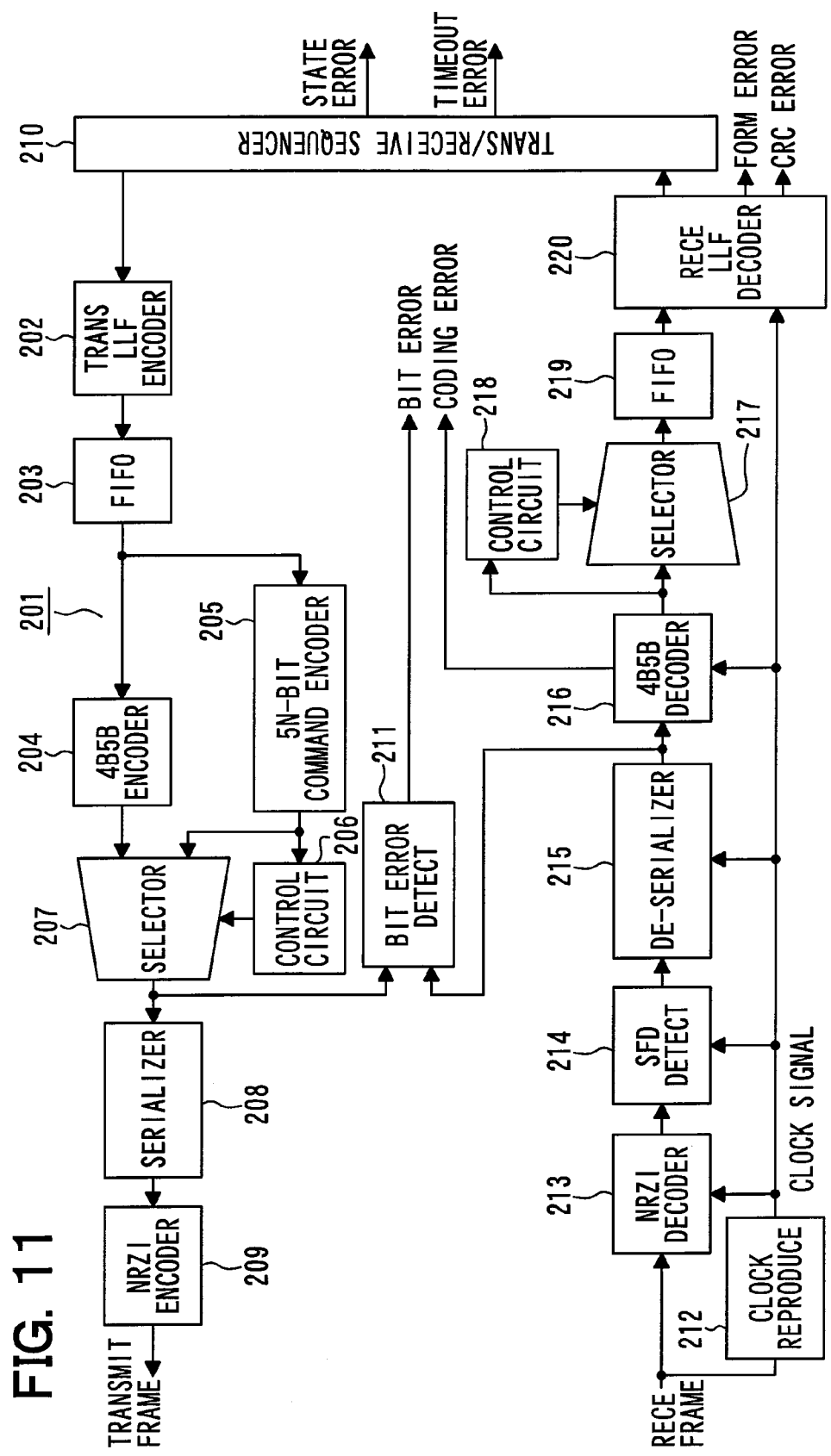
FIG. 11 is a functional block diagram illustrating a configuration of a data communication apparatus according to a third embodiment of the present disclosure.

FIG. 11 is a functional block diagram illustrating a configuration of a data communication apparatus according to a third embodiment of the present disclosure. The data communication apparatus 201 includes, as the functional blocks of a transmission system, a transmission LLF (Link Layer Frame) encoder 202, a FIFO (First In First Out) 203, a 4B5B encoder 204, a 5N-bit command encoder 205, a control circuit 206, a selector 207, a serializer 208, and an NRZI encoder 209.

When receiving a transmission data from a transmission and reception sequencer 210 (also referred to as a state error detection device or means, or a timeout error detection device or means), the transmission LLF encoder 202 generates a link layer frame (LLF) containing (i) an identifier for identifying (specifying) a frame, (ii) a remote which indicates write or read of data; (iii) a size which indicates a length of data; (iv) an ID which indicates an address space to access; (v) a data (transmission data); and (vi) a CRC, then outputting the link layer frame to the 4B5B encoder 204 and 5N-bit command encoder 205 via the FIFO 203.

When receiving the link layer frame in an 8-bit string via the FIFO 203 from the transmission LLF encoder 202, the 4B5B encoder 204 converts each of a 4-bit string of the high order and a 4-bit string of the low order included in the 8-bit string into 5-bit strings according to the 4B5B encoding table (not shown), and generates a 10-bit string, outputting the generated 10-bit string to the selector 207. In this case, the 4B5B encoder 204 converts the 4-bit string into the 5-bit string such that the consecutive "0" data values is less than consecutive three bits.

When receiving the link layer frame via the FIFO 203 from the transmission LLF encoder 202, the 5N-bit command encoder 205 generates a preamble which is a bit string for synchronization, an SFD (Start Frame Delimiter) (frame start portion) for detecting a head end of the link layer frame, and an EFD (End Frame Delimiter) (frame end portion) for detecting a tail end of the link layer frame, and outputs the generated ones to the control circuit 206 and the selector 207.

When receiving the 10-bit string from the 4B5B encoder 204 and the preamble, SFD, and EFD from the 5N bit command encoder 205, the selector 207 generates a physical layer frame (PLF) by adding the preamble, SFD, and EFD to the 10-bit string according to a control instruction inputted from the control circuit 206, and outputs to the serializer 208 and the bit error detection portion (data comparison portion) 211 (also referred to as a bit error detection device or means).

When receiving the physical layer frame from the selector 207, the serializer 208 applies a parallel/serial conversion to the physical layer frame, and outputs the physical layer frame having undergone the parallel/serial conversion to the NRZI encoder 209. When receiving the physical layer frame having undergone the parallel/serial conversion from the serializer 208, the NRZI encoder 209 encodes the physical layer frame to an NRZI code, and transmits it to the communication path as a transmission frame via a transmission terminal.

In contrast, the data communication apparatus 201 includes, as the functional blocks of a reception system, a clock reproduction portion 212, an NRZI decoder 213, an SFD (Start Frame Delimiter) detection portion 214, a de-serializer 215, a 4B5B decoder 216 (also referred to as a coding error detection device or means), selector 217, a control circuit 218, a FIFO 219, and a reception LLF decoder 220 (also referred to as a form error detection device or means, a CRC error detection device or means, and a code error detection device or means).

The clock reproduction portion 212 extracts a clock component from the physical layer frame of the NRZI code received as a reception frame from the communication path, and reproduces a clock signal, supplying the reproduced clock signal to each functional block. The NRZI decoder 213 decodes the physical layer frame of the NRZI code received as the reception frame from the communication path, and outputs the decoded one to the SFD detection portion 214.

When receiving the physical layer frame from the NRZI decoder 213, the SFD detection portion 214 detects an SFD contained in the physical layer frame to detect a head end of the link layer frame, and outputs the link layer frame to the de-serializer 215. When receiving the link layer frame from the SFD detection portion 214, the de-serializer 215 applies a serial/parallel conversion to a bit string of the link layer frame, and outputs it to the 4B5B decoder 216 and the bit error detection portion 211. The 4B5B decoder 216 applies an inverse conversion to the 10-bit string of the link layer frame having undergone the serial/parallel conversion in the de-serializer 215 into an 8-bit string according to the 4B5B encoding table (not shown), and outputs it to the selector 217 and the control circuit 218.

When receiving the 8-bit string of the link layer frame from the 4B5B decoder 16, the selector 207 outputs the received 8-bit string to the reception LLF decoder 220 via the FIFO 219 according to the control instruction from the control circuit 218. When receiving the 8-bit string of the link layer frame via the FIFO 219 from the selector 217, the reception LLF decoder 220 outputs the 8-bit string of the link layer frame to the transmission and reception sequencer 210.

Figure 12:
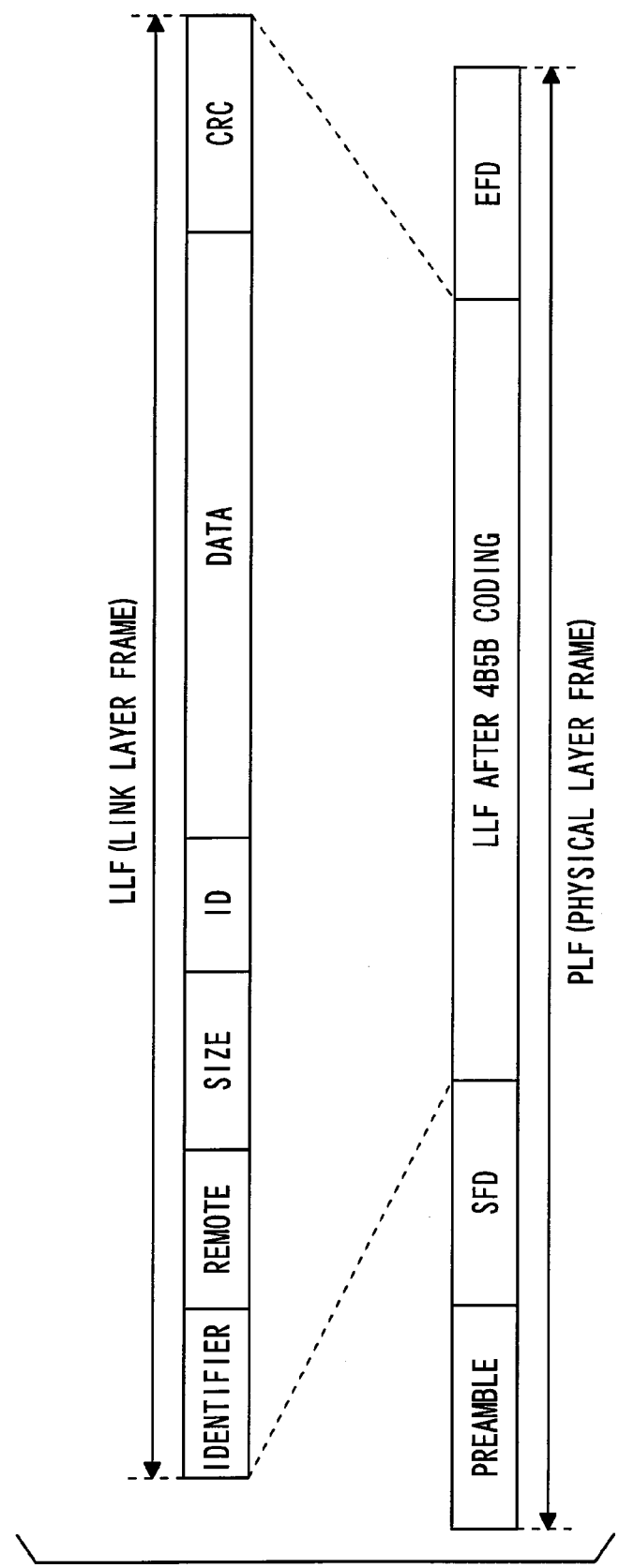
FIG. 12 is a diagram illustrating frame structures of a link layer frame and a physical layer frame according to the third embodiment.
Figure 13:
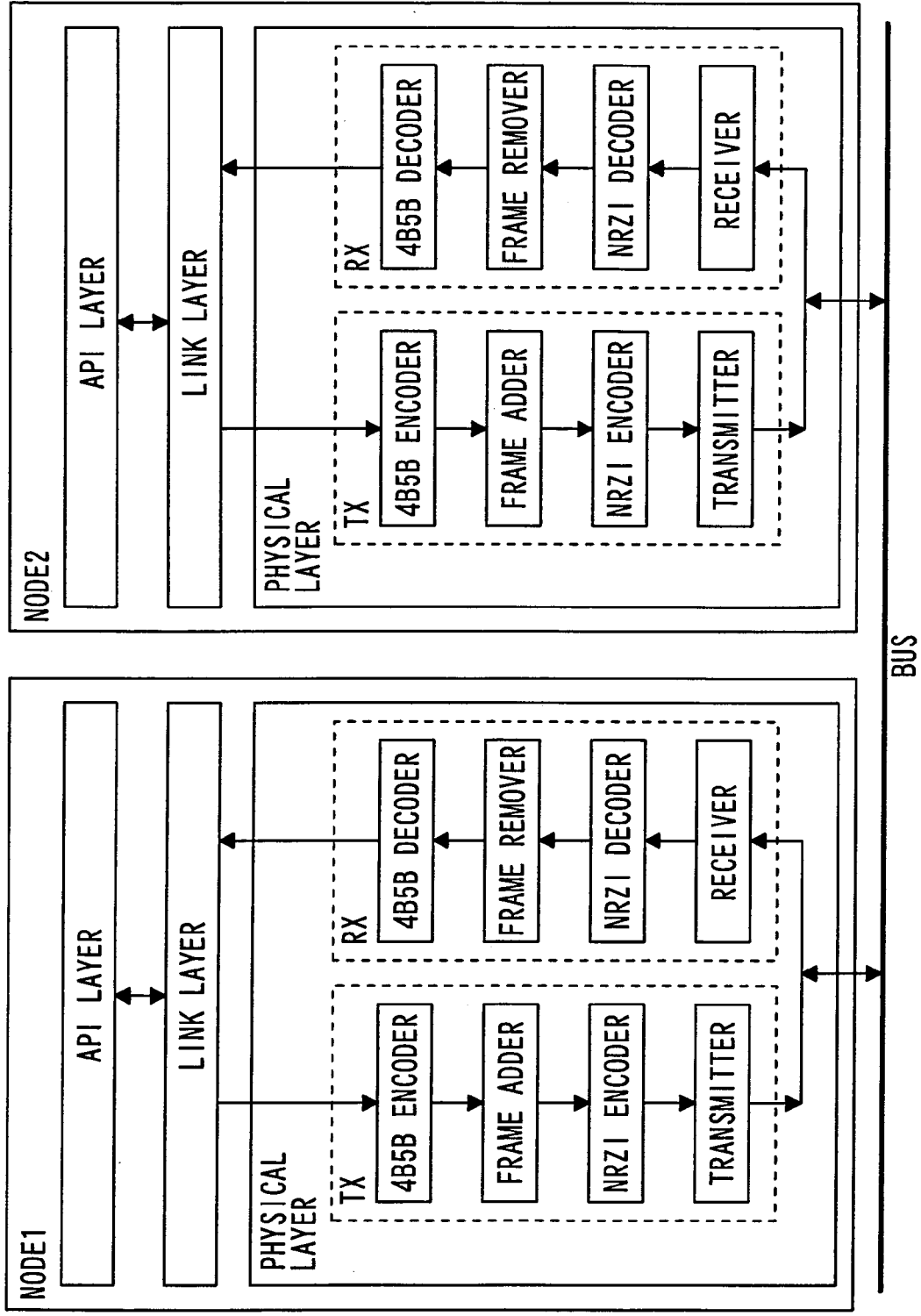
FIG. 13 is a diagram illustrating a functional hierarchical structure according to the third embodiment.
Figure 14:
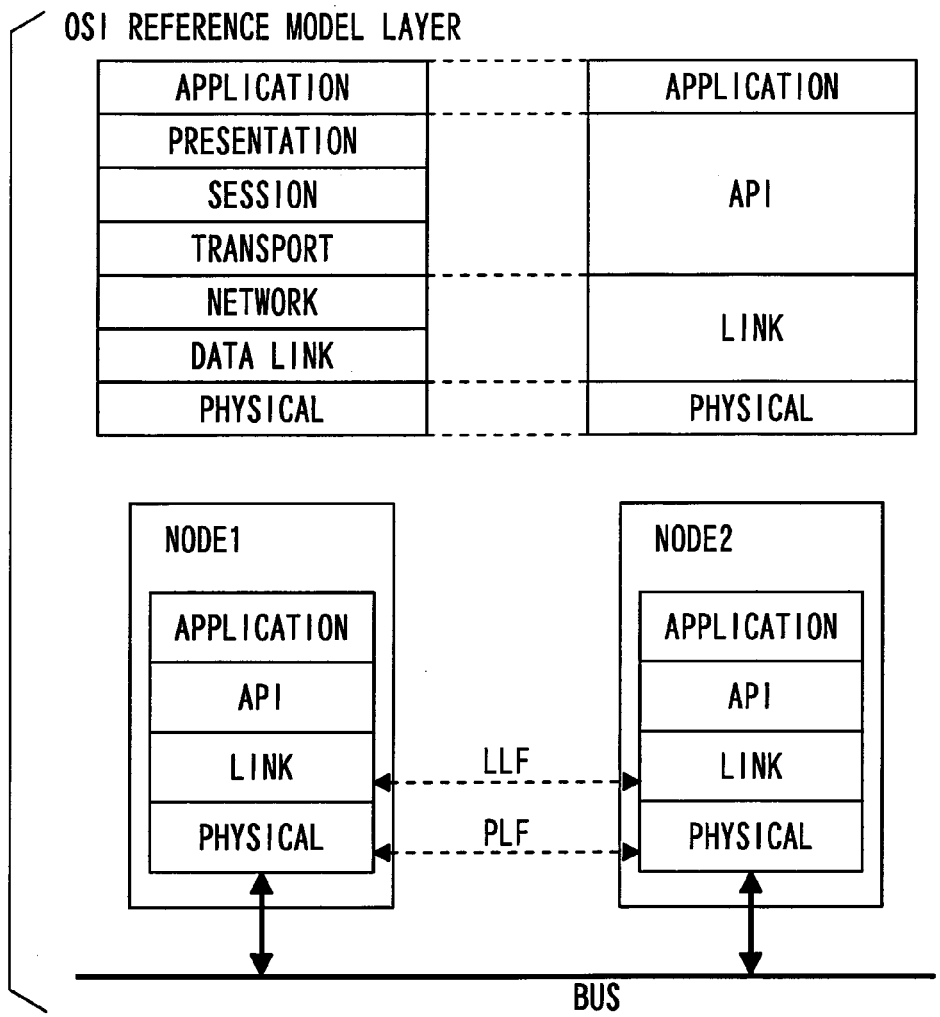
FIG. 14 is a diagram illustrating a contrast with an open systems interconnection reference model according to the third embodiment.

The frame structures of the above-mentioned link layer frame and physical layer frame have an association relation illustrated in FIG. 12. Further, as illustrated in FIG. 13, the data communication apparatus 201 divides the function into a hierarchical structure that contains a physical layer, a link layer, and an API (Application Program Interface) layer. The physical layer can be divided into the function portion of controlling transmission (TX) and the function portion of controlling reception (RX). The physical layer, the link layer, and the API layer in the present embodiment are compared with the OSI (Open Systems Interconnection) reference model stipulated by International Organization for Standardization (ISO) as follows. As illustrated in FIG. 14, the physical layer corresponds to the first layer (physical layer) of the OSI reference model; the link layer corresponds to the second layer (data link layer) and the third layer (network layer) of the OSI reference model; and the API layer corresponds to the fourth layer (transport layer), the fifth layer (session layer), and the sixth layer (presentation layer) of the OSI reference model. The link layer frames are communicated logically between the link layers of the data communication apparatus 201, whereas the physical layer frames are communicated physically between the physical layers of the data communication apparatus 201.

Now, the above-mentioned data communication apparatus 201 has an error detection function to be explained later and performs an error detection process at the time of data transmission and an error detection process at the time of data reception. The following will explain the error detection process at the time of data transmission and the error detection process at the time of data reception in order.

It is further noted that a flowchart or the processing of the flowchart in the present application includes sections (also referred to as steps), which are represented, for instance, as S1. Further, each section can be divided into several sub-sections while several sections can be combined into a single section. Furthermore, each of thus configured sections can be referred to as a device, module, or means.

(1) Error Detection Process at the Time of Data Transmission

Figure 15:
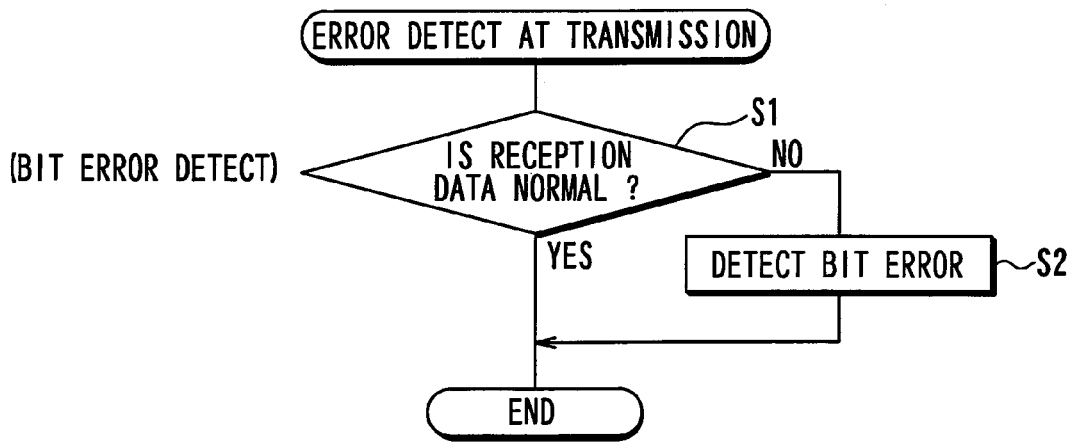
FIG. 15 is a flowchart diagram illustrating an error detection process in data transmission according to the third embodiment.

The data communication apparatus 201 performs an error detection at the time of data transmission illustrated in FIG. 15. That is, the data communication apparatus 201 performs a bit error detection which determines whether a transmission data is normal using the bit error detection portion 211 (S1). The data communication apparatus 201 compares data contained in the physical layer frame inputted into the bit error detection portion 211 from the selector 207 with data contained in the link layer frame inputted into the bit error detection portion 211 from the de-serializer 215. When detecting a data different from the transmission data or detecting no transmission data, it is determined that the transmission data is not normal ("NO" at S1). It is detected that the bit error occurred (S2). Thus, the data communication apparatus 201 performs the bit error detection at the time of data transmission.

(2) Error Detection Process at the Time of Data Reception

Figure 16:
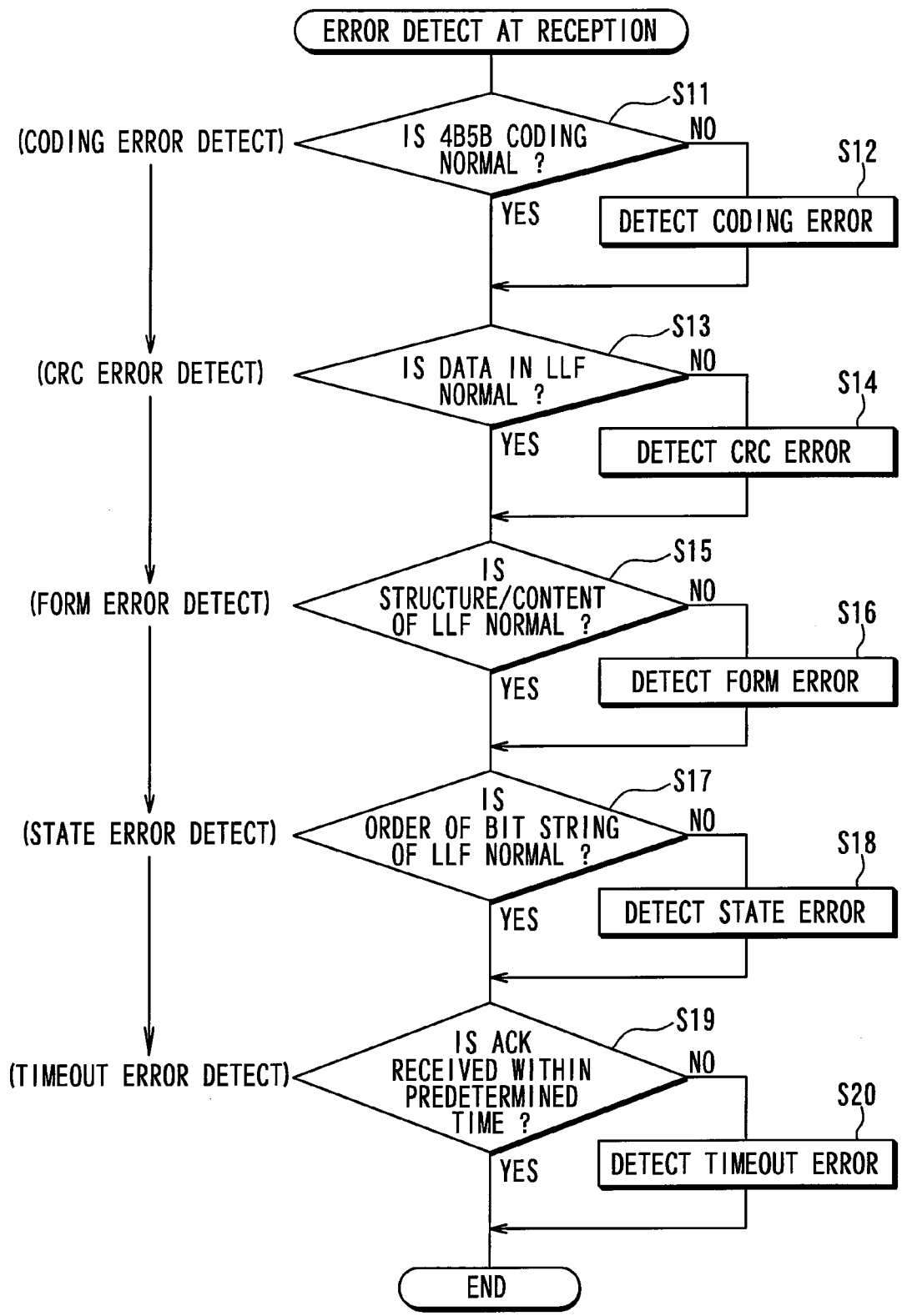
FIG. 16 is a flowchart diagram illustrating an error detection process in data reception according to the third embodiment.

The data communication apparatus 201 performs an error detection at the time of data reception illustrated in FIG. 16. That is, the data communication apparatus 201 performs a coding error detection which determines whether the 4B5B coding is normal using the 4B5B decoder 216 (S11). The data communication apparatus 201 determines the 8-bit string generated by the inverse conversion of the 10-bit string of the link layer frame, which is inputted from the de-serializer 215 into the 4B5B decoder 216, according to the 4B5B encoding table. When a bit string (bit string of the undefined) other than the bit string illustrated in the 4B5B encoding table is detected, it is determined that the 4B5B coding is not normal ("NO" at S11). It is thus detected that the coding error occurred (S12).

Subsequently, the data communication apparatus 201 performs a CRC (Cyclic Redundancy Check) error detection which determines whether data contained in the link layer frame is normal using the reception LLF decoder 220 (S13). The data communication apparatus 201 applies, to the calculation using the CRC calculation equation, the 8-bit string of the link layer frame, which is inputted from the selector 217 via the FIFO 219 into the reception LLF decoder 220, using the reception LLF decoder 220. When an error is detected in the calculation using the CRC calculation equation, it is determined that the data contained in the link layer frame is not normal ("NO" at S13). It is thus detected that the CRC error occurred (S14).

Subsequently, the communication apparatus 201 performs a form error detection which determines whether the configuration and content of the link layer frame is normal using the reception LLF decoder 220 (S15). The data communication apparatus 201 determines the 8-bit string of the link layer frame inputted into the reception LLF decoder 220 via the FIFO 19 from the selector 217. When detecting the reception of a link layer frame different from the condition of the reception header, It is determined that the configuration and the content of the link layer frame is not normal ("NO" at S15). It is thus detected that the form error occurred (S16).

Subsequently, the communication apparatus 201 performs a state error detection which determines whether the order of the bit string of the link layer frame is normal using the transmission and reception sequencer 210 (S17). When detecting the reception of the link layer frame different from the normal sequence, the data communication apparatus 201 determines that the order of the bit string of the link layer frame is not normal ("NO" at S17). It is thus detected that the state error occurred (S18).

Finally, the data communication apparatus 201 performs a timeout error detection which determines whether the ACK frame is received normally within a predetermined time using the transmission and reception sequencer 210 (S19). The data communication apparatus 201 transmits, as a transmission frame, a data frame, a burst frame, or a command frame, and determines whether a response (ACK frame) to the transmission frame is received within a predetermined time since the time of transmitting the transmission frame. When it is determined that the response is not received within the predetermined time, it is determined that the ACK frame is not normally received within the predetermined time ("NO" at S19). It is thus detected that the timeout error occurred (S20). Thus, the data communication apparatus 201 performs the coding error detection, CRC error detection, form error detection, state error detection, and timeout error detection one by one at the time of data reception.

FIG. 17 illustrates the classifications of the above-mentioned errors, and the detecting nodes (the transmission node or the reception node). It is noted that the transmission node is the data communication apparatus 201 which transmits a transmission frame, and the reception node is the data communication apparatus 1 which receives a reception frame.

As explained above, according to the present embodiment, in the data communication apparatus 201, the handshake communication method is adopted using the ACK frame for realizing non-collision. The 4B5B coding of the link layer frame is made. The preamble, SFD, and EFD are added to the link layer frame. The requirement for clock reproduction is added by the NRZI coding of the physical layer frame. Thereby, the data communication speed can be raised. Moreover, when the transmission frame is transmitted to the communication path, a bit error detection is made. When receiving a reception frame from the communication path, the data communication apparatus 201 performs the coding error detection, CRC error detection, form error detection, state error detection, and timeout error detection, thereby securing the high reliability.

The present disclosure is not limited only to the above-mentioned embodiment, and can be modified or extended as follows. The data communication apparatus 201 may be a node connected to an in-vehicle LAN, or a node connected to any LAN other than the in-vehicle LAN.

Fourth Embodiment

Example 1

Figure 18:
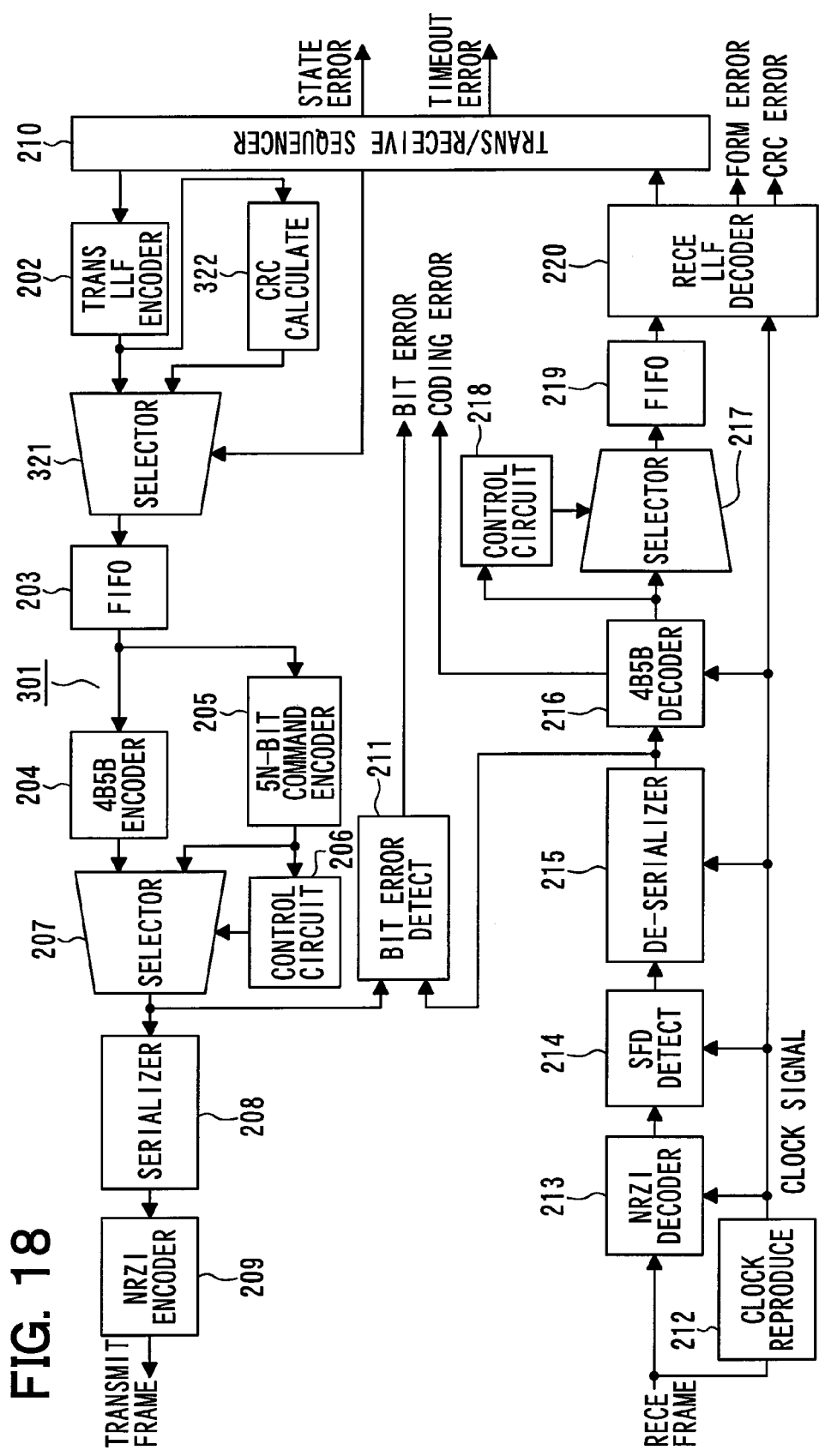
FIG. 18 is a functional block diagram illustrating a configuration of a data communication apparatus according to an example 1 of a fourth embodiment of the present disclosure.

Hereinafter, an example 1 of a fourth embodiment of the present disclosure will be explained with reference to FIGS. 18 to 24, and FIGS. 12 to 15, 17 used in the third embodiment. FIG. 18 is a functional block diagram illustrating a configuration of a data communication apparatus according to the example 1 of the fourth embodiment. The data communication apparatus 301 including a transmitter (i.e., transmission side) and a receiver (i.e., reception side) is different from the data communication apparatus 201 of the third embodiment in FIG. 11 in respect of containing a selector 321 and a CRC calculation portion 322.

Further, like in the third embodiment, when the transmission LLF encoder 202 receives a transmission data from the transmission and reception sequencer 210, the transmission LLF encoder 202 outputs an identifier for identifying (i.e., specifying) a frame, a bit string that indicates a remote which indicates a data write or a data read, a size which illustrates a length of a data, an ID which illustrates an address space to access, and the data (transmission data). In contrast, unlike the third embodiment, the link layer frame (LLF) is generated without a CRC code and is outputted to the selector 321 and the CRC calculation portion 322. The CRC calculation portion 322 generates a 16-bit CRC code about a header portion (i.e., control information) and a data portion of the inputted link layer frame, and outputs it to the selector 321. The switching control of the selector 321 is executed by the transmission and reception sequencer 210. By the switching control, a link layer frame is generated such that the CRC code is arranged in a specified position in the communication frame and inputted into the FIFO 203. Further, like in the third embodiment, the link layer frame is inputted into the 4B5B encoder 204 and 5N-bit command encoder 205 via the FIFO 203.

The frame structure of the above-mentioned link layer frame and the frame structure of the physical layer frame have the same association relation as illustrated in FIG. 12 of the third embodiment. Further, as illustrated in FIG. 13 of the third embodiment, the function is divided into the hierarchical structure that contains a physical layer, a link layer, and an API (Application Program Interface) layer. The physical layer can be divided into the function portion of controlling transmission (DC) and the function portion of controlling reception (RX).

Furthermore, in the present example, the physical layer, the link layer, and the API layer are compared with the OSI (Open Systems Interconnection) reference model stipulated by International Organization for Standardization (ISO) as illustrated in FIG. 14 of the third embodiment, similarly.

Figure 19:
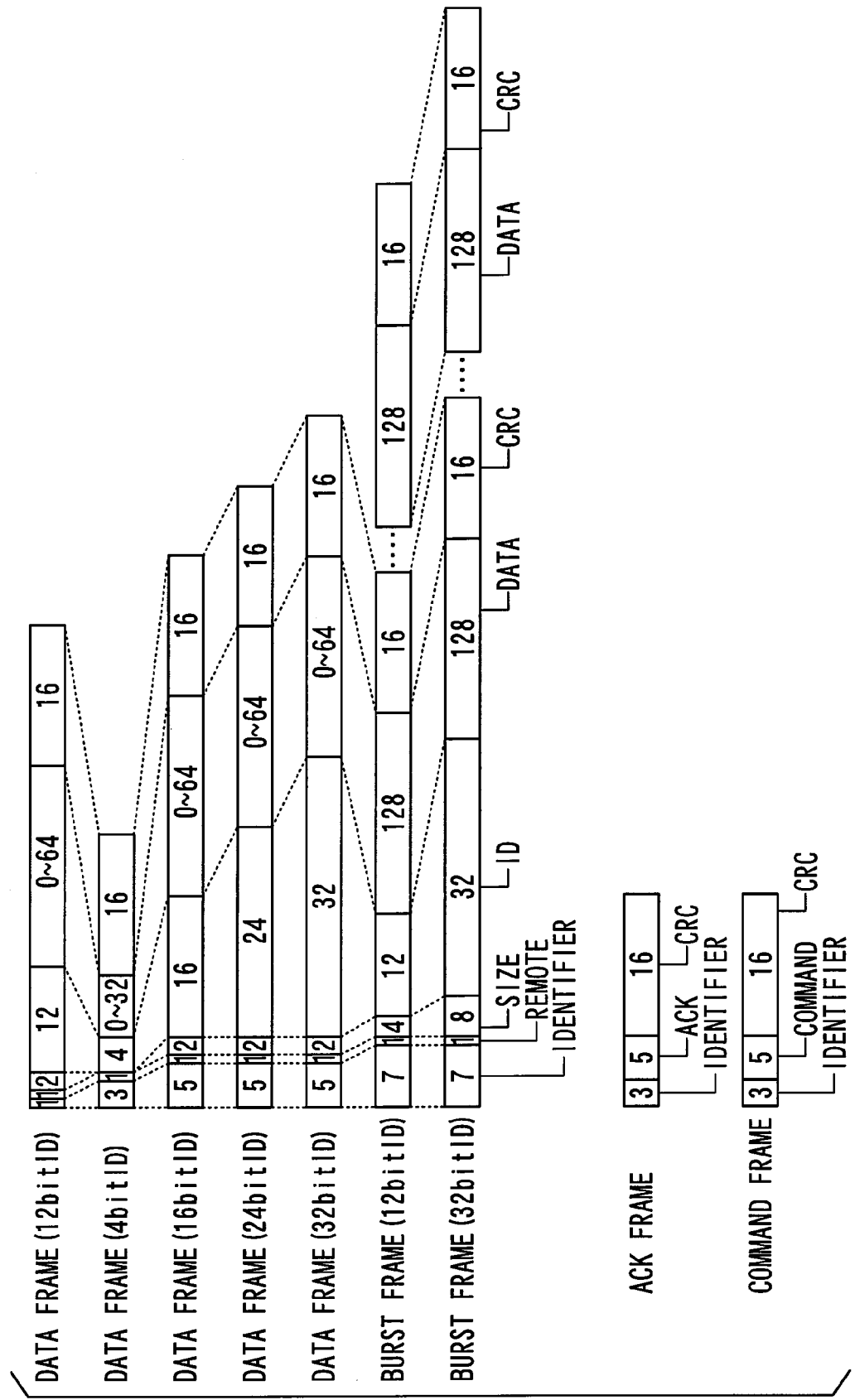
FIG. 19 is a diagram illustrating a frame structure of each frame according to the example 1 of the fourth embodiment.

The following will explain a procedure to determine the bit number of an identifier (an identifier length) assigned to each frame with reference to FIG. 19 and FIG. 20. In the present example, it is premised that (i) a frame having the highest communication frequency (use frequency) in a communication network is a data frame that has an ID length of the predetermined number of bits, (ii) a frame having the second highest communication frequency is an ACK frame, and (iii) a frame having the third highest communication frequency is a command frame. Further, the data communication apparatus 301 is supposed to be used in a communication system such as an in-vehicle communication network (i.e., in-vehicle LAN (Local Area Network)) mounted in a vehicle, for example. Such an in-vehicle communication network has a severe noise environment; thus, the communication failure occurs frequently. As a result, the communication frequency of the ACK frame is supposed to be the second highest.

First, a data frame is determined which has the highest communication frequency in the communication network. In detail, Na is defined as the number of nodes (chips) connected to the communication path; Nb is defined as an address space required for the nodes; N, N1, N2 are coefficients. N1 is obtained to satisfy Na≤2N1. N2 is obtained to satisfy Nb=2N2. N is obtained to be N1+N2. In the communications system according to present example, it is assumed to be Na≤8. N1=3 can be thus obtained. When it is assumed to be N2=9, N=12 is obtained. Thus, the data frame which has an ID length of 12 bits (also referred to as the 12-bit ID data frame) is determined to be a data frame which has the highest communication frequency in the communication network.

Next, in the above-determined data frame having the ID length of 12 bits, the bit number of bits of the remote (remote length), the bit number of bits of the size (size length), the bit number of bits of the ID (ID length) are specified. The bit number of bits of the identifier (identifier length) is determined such that the bits of the total sum of the identifier length, the remote length, the size length, and the ID length is a multiple of 8 (8N, i.e., 8 bits, 16 bits, 24 bits, 32 bits, . . . ).

That is, as illustrated in FIG. 19, the data frame which has an ID length of 12 bits has a remote length of 1 bit, a size length of 2 bits, an ID length of 12 bits. The bit number of bits of the identifier (identifier length) is determined to be 1 bit such that the bits of the total sum of the identifier length, the remote length, the size length, and the ID length is the closest multiple of 8 (i.e., 16 bits). In detail, the identifier assigned to the data frame having an ID length of 12 bits is determined to be "0", as illustrated in FIG. 20.

Next, the bit number of the identifier is determined for assigning to the ACK frame having the second highest communication frequency next to the data frame having an ID length of 12 bits. The ACK indicates a response to a request. The number of bits of the identifier (identifier length) is determined to be 3 bits such that the bits of the total sum of the ACK length, the CRC length, and the identifier length is the closest multiple of 8 (i.e., 24 bits). In detail, the identifier assigned to the ACK frame is determined to be "100", as illustrated in FIG. 20.

Next, the bit number of the identifier is determined for assigning to the command frame having the third highest communication frequency next to the data frame having an ID length of 12 bits and the ACK frame. The command indicates control information. That is, as illustrated in FIG. 19, the command frame contains the command length of 5 bits and the CRC length of 16 bits. The number of bits of the identifier (identifier length) is determined to be 3 bits such that the bits of the total sum of the command length, the CRC length, and the identifier length is the closest multiple of 8 (i.e., 24 bits). In detail, the identifier assigned to the command frame is determined to be "101", as illustrated in FIG. 20.

Moreover, expansion use data frames that are unnecessary at the present system may be required in future expansion of the communication system such as the increase of the address space or the communication of data having longer data length. The data communication apparatus 301 determines an identifier length that is the bit number of bits of an identifier assigned to the expansion use data frames as follows. The following is on a premised that the expansion use data frames include a data frame that has an ID length of 4 bits, a data frame that has an ID length of 16 bits, a data frame that has an ID length of 24 bits, and a data frame that has an ID length of 32 bits. The data frame which has an ID length of 4 bits has a remote length of 1 bit, a size length of 0 bit, an ID length of 4 bits. The bit number of bits of the identifier (identifier length) is determined to be 3 bits such that the bits of the total sum of the identifier length, the remote length, the size length, and the ID length is the closest multiple of 8 (i.e., 8 bits). In detail, the identifier assigned to the data frame having an ID length of 4 bits is determined to be "110", as illustrated in FIG. 20.

The data frame which has an ID length of 16 bits has a remote length of 1 bit, a size length of 2 bits, an ID length of 16 bits. The bit number of bits of the identifier (identifier length) is determined to be 5 bits such that the bits of the total sum of the identifier length, the remote length, the size length, and the ID length is the closest multiple of 8 (i.e., 24 bits). In detail, the identifier assigned to the data frame having an ID length of 16 bits is determined to be "11100", as illustrated in FIG. 20. The data frame which has an ID length of 24 bits has a remote length of 1 bit, a size length of 2 bits, an ID length of 24 bits. The bit number of bits of the identifier (identifier length) is determined to be 5 bits such that the bits of the total sum of the identifier length, the remote length, the size length, and the ID length is the closest multiple of 8 (i.e., 32 bits). In detail, the identifier assigned to the data frame having an ID length of 24 bits is determined to be "11101", as illustrated in FIG. 20.

The data frame which has an ID length of 32 bits has a remote length of 1 bit, a size length of 2 bits, an ID length of 32 bits. The bit number of bits of the identifier (identifier length) is determined to be 5 bits such that the bits of the total sum of the identifier length, the remote length, the size length, and the ID length is the closest multiple of 8 (i.e., 40 bits). In detail, the identifier assigned to the data frame having an ID length of 32 bits is determined to be "11110", as illustrated in FIG. 20. Further, a burst frame contains several data (i.e., several data elements) and several CRCs. The bit number of the identifier of the burst frame is arbitrarily determined, unlike the above-mentioned data frame of which the bit number of bits of the identifier (identifier length) is determined such that the bits of the total sum of the identifier length, the remote length, the size length, and the ID length is a closest multiple of 8.

While the burst frame which has an ID length of 12 bits has a remote length of 1 bit, a size length of 4 bits, and an ID length of 12 bits, the bit number of the identifier is determined to be 7 bits, for instance. Herein, the total sum of the bits is 24. In detail, the identifier assigned to the burst frame having an ID length of 12 bits is determined to be "1111100", as illustrated in FIG. 20. Further, while the burst frame which has an ID length of 32 bits has a remote length of 1 bit, a size length of 8 bits, an ID length of 32 bits, the bit number of the identifier is determined to be 7 bits, for instance. Herein, the total sum of the bits is 48. In detail, the identifier assigned to the burst frame having an ID length of 32 bits is determined to be "1111101", as illustrated in FIG. 20. It is noted that in the burst frame, a 16-bit CRC code (error detection portion) is added to every 128 bits (i.e., 16 bytes) corresponding to each unit data.

Figure 21:
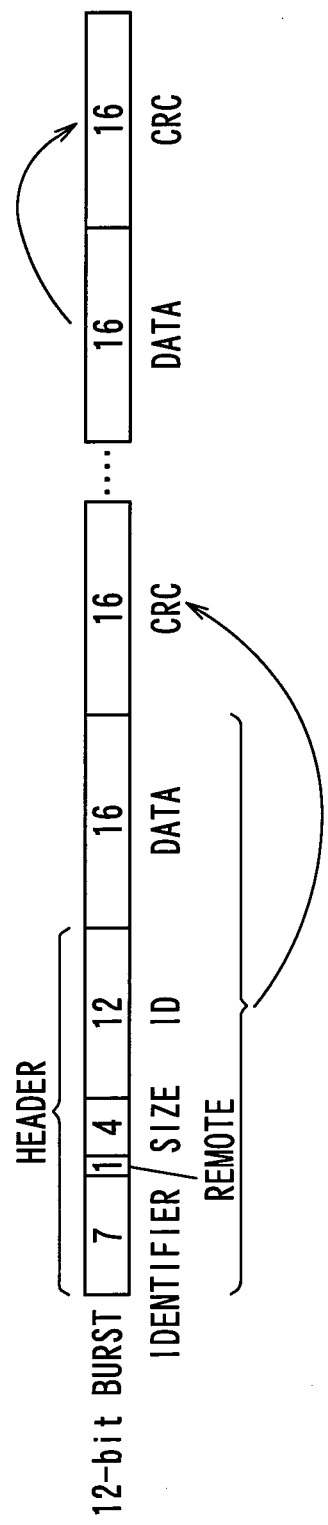
FIG. 21 is a diagram illustrating generation of a CRC code about a 12-bit ID burst frame according to the example 1 of the fourth embodiment.

In addition, FIG. 21 illustrates a burst frame with a 12-bit ID. The portion from an identifier at the beginning via a remote, a size to an ID is equivalent to a header. A first CRC code is arranged to follow a unit data portion that follows the header. In the present example, the first CRC is generated as a control-use error detection code, which is an error detection code for control, for a calculation target that is a combination of the header and the (first) unit data portion using the CRC calculation portion 322 (also referred to as a control-use error detection code generation device or means). Therefore, an error occurring in the header can be detected using the first CRC code.

Now, the above-mentioned data communication apparatus 301 has an error detection function to perform an error detection process at the time of data transmission and an error detection at the time of data reception. Hereinafter, the error detection process at the time of data transmission and the error detection process at the time of data reception are explained one by one with reference to FIGS. 15 and 17 of the third embodiment, and FIG. 22.

(1) Error Detection Process at the Time of Data Transmission

The data communication apparatus 301 performs basically the same S1, S2 of the error detection process at the time of data transmission as those of the data communication apparatus 201 in FIG. 15 of the third embodiment.

(2) Error Detection Process at the Time of Data Reception

Figure 22:
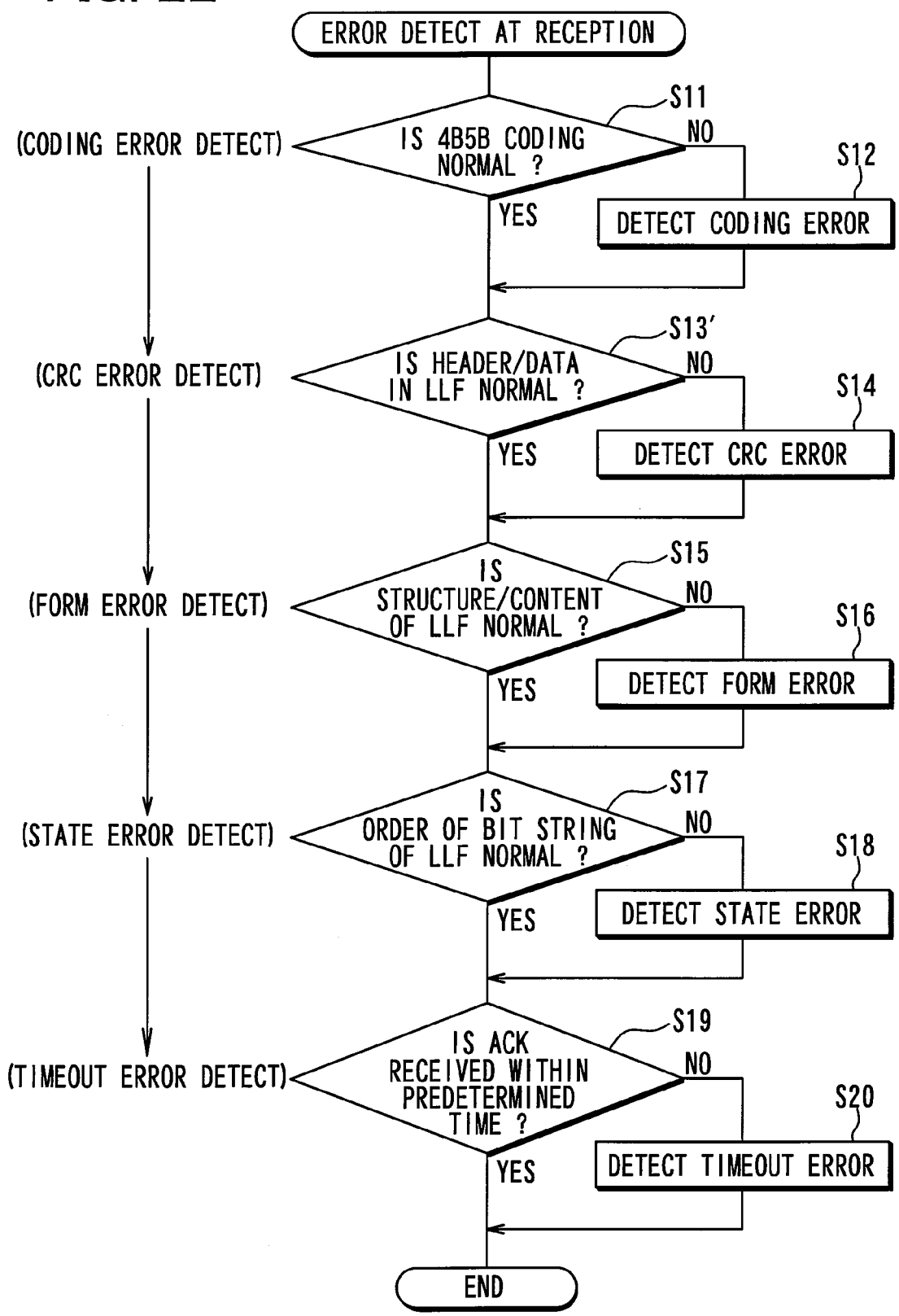
FIG. 22 is a flowchart diagram illustrating an error detection process in data reception according to the example 1 of the fourth embodiment.

The data communication apparatus 301 performs an error detection at the time of data reception illustrated in FIG. 22. It is noted that the error detection process at the time of data reception is almost the same as the error detection process at the time of data reception of the data communication apparatus 201 of the third embodiment in FIG. 16. The difference is only in respect of S13', where the reception LLF decoder 220 performs a CRC error detection (coding error detection) which determines whether a header as well as a data (or data element) is normal in the link layer frame.

Under such a configuration, the data communication apparatus 301 performs the coding error detection, CRC error detection, form error detection, state error detection, and timeout error detection one by one at the time of data reception.

Further, the contents of the errors are the same as those in the third embodiment. Yet further, the classifications of the errors, and the detecting nodes (the transmission node or the reception node) are similarly illustrated in FIG. 17 of the third embodiment. Similarly, it is noted that the transmission node is the data communication apparatus 301 which transmits a transmission frame, and the reception node is the data communication apparatus 301 which receives a reception frame.

Figure 23:
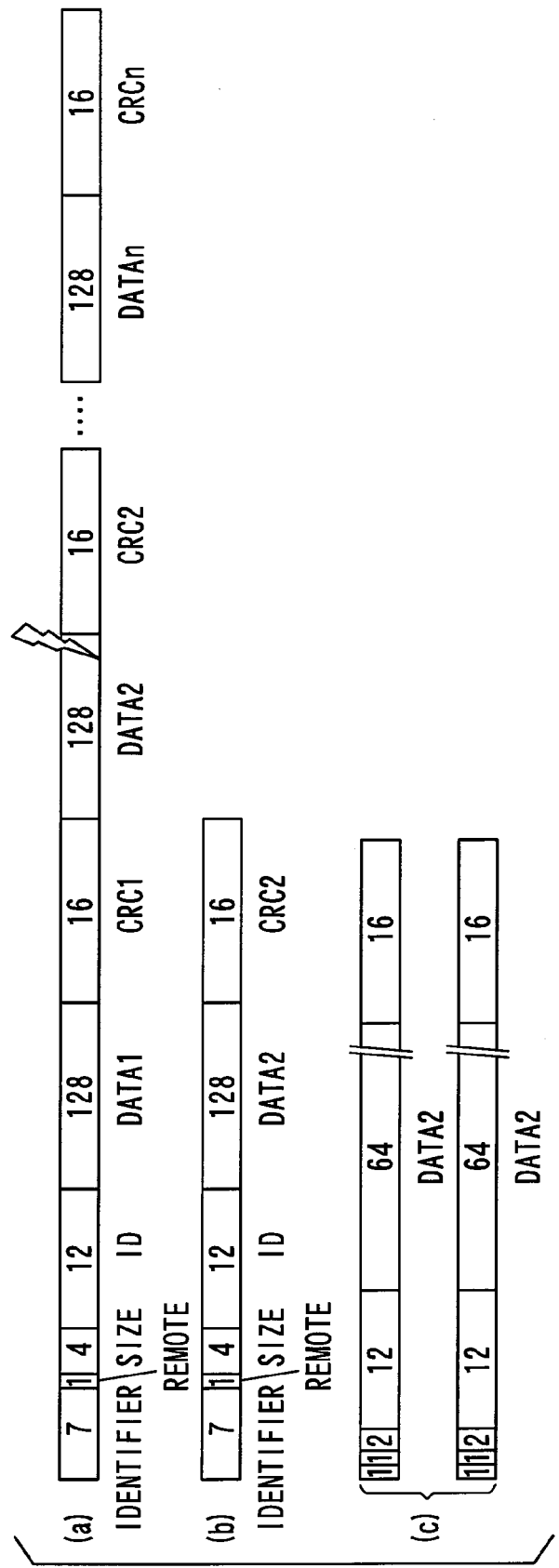
FIG. 23 is a diagram illustrating a process to request a re-transmission of a part of a data about a 12-bit ID burst frame according to the example 1 of the fourth embodiment.
Figure 24:
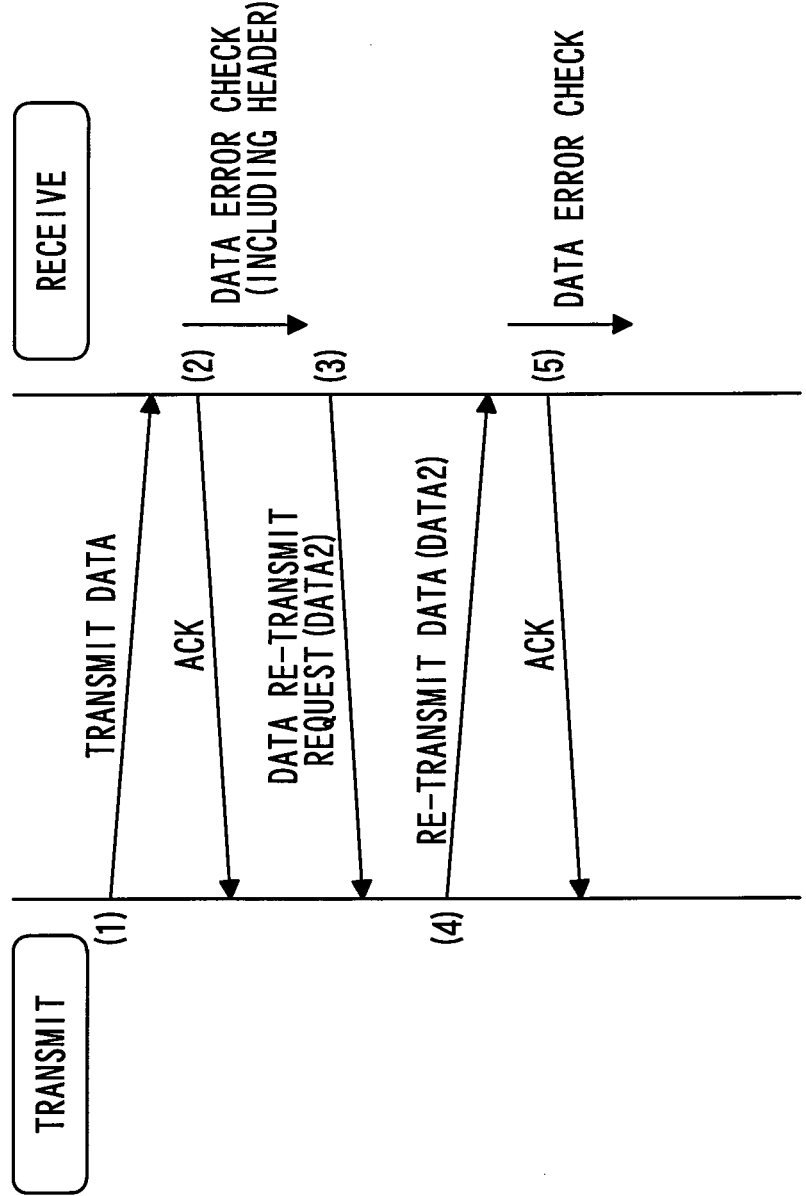
FIG. 24 is a diagram illustrating a processing sequence during transmission and reception according to the example 1 of the fourth embodiment.

The following will explain a process executed when a CRC error is detected in a part of a unit data portion in a received burst frame with reference to FIGS. 23, 24. As illustrated in FIG. 23 (a), an error in the second ordered unit data portion (i.e., DATA2) is detected using the CRC2. In such a case, the reception side demands re-transmission of only DATA2 from the transmission side. FIG. 24 illustrates a re-transmission process sequence. (1) The transmission side transmits a 12-bit ID burst frame. (2) The reception side receives the frame and replies an ACK frame. The reception side executes an error checking using each CRC code. Thereby, it is assumed that an error is detected about DATA2. (3) The reception side transmits a frame which demands a re-transmission of DATA2 to the transmission side. The transmission side thereby receives the above request frame of the re-transmission. (4) The transmission side re-transmits the portion of DATA2. (5) The reception side receives the re-transmitted data frame (i.e., DATA2) and then replies an ACK frame. The reception side executes an error checking again about DATA2 that is re-transmitted.

FIG. 23 (b) illustrates a communication frame which is re-transmitted by the transmission side in the above (4). The communication frame adds DATA2 and CRC2 to the same header portion of (a). In this case, the identifier may be the same one as illustrated in (a) to indicate the burst transmission, or one to indicate the re-transmission of a part of data containing a header. In addition, FIG. 23 (c) illustrates the case where DATA2 of 128 bits is divided into two communication frames to each contain 64 bits and re-transmitted as separate two communication frames.

As explained above, the present example performs communications using the frame that contains the header having a control code, the data portion having a transmission data, and the error detection portion having a CRC code. The transmission side executes a transmission by putting a control-use error detection code for error detecting a header in the error detection portion. The reception side executes an error detection of the header based on the control-use error detection code. Thus, an occurrence of an error in the header can be detected based on the CRC code. In addition, the transmission side divides the data portion into several unit data portions, each of which includes the predetermined number of bits (e.g., 128 bits (16 bytes)), and provides several error detection portions, which execute error detections, so as to correspond to the several unit data portions. The reception side executes an error detection for each of the several unit data portions. Therefore, the error detection can be made for each unit data portion in the burst transmission frame.

In addition, in the transmission side, the error detection portion generates a CRC code to perform an error detection for both of the header and the following first unit data portion; thus, the increase of the bit number of the error detection code can be suppressed. Furthermore, (i) the control-use error detection code and (ii) the error detection code added to each of the several unit data portions are the same kind of error detection code (i.e., CRC); the processes in both the transmission side and the reception side are easy. In addition, the reception side transmits a request of re-transmission of an error-occurred portion, in which an error was detected by the CRC code, to the transmission side; the transmission side re-transmits only the error-occurred portion upon receiving the request of re-transmission. Therefore, even when the burst transmission has a longer communication frame that is transmitted at once, only the requested unit data portion can be transmitted again. The communication efficiency thus improves.

In addition, the transmission side applies the 4B5B coding to a communication frame to generate a link layer frame having undergone the 4B5B coding; adds a preamble, a frame start portion, and a frame end portion to the link layer frame having undergone the 4B5B coding, generating a physical layer frame; applies the NRZI coding to the physical layer frame; and performs the bit error detection and form error detection when transmitting to the communication path. In contrast, the reception side applies a coding error detection, error detection using an CRC code, form error detection, and state error detection to the received physical layer frame. Furthermore, the transmission side detects a timeout error. Therefore, the CRC code is combined with other various error detections; the communication reliability can be further raised.

Example 2

Figure 25:
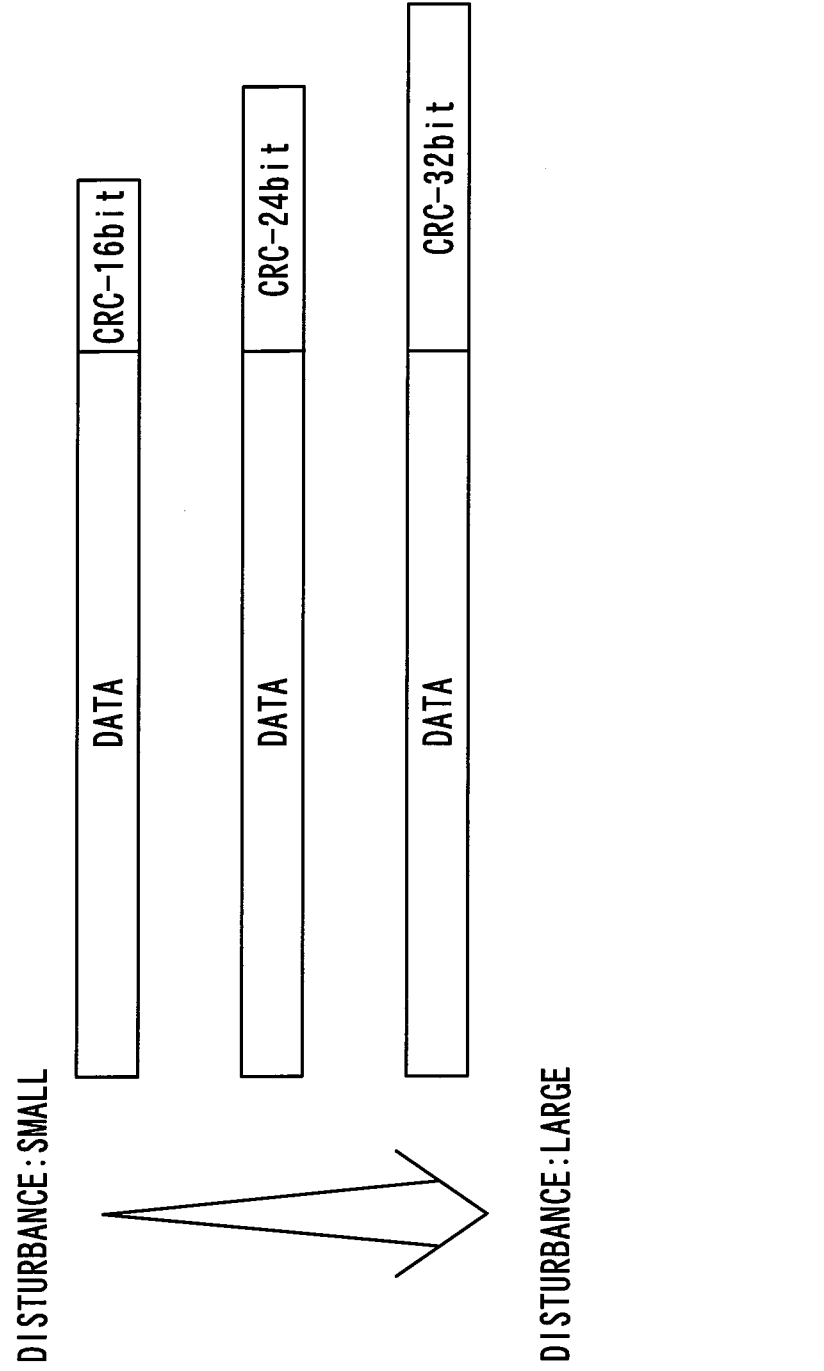
FIG. 25 is a diagram illustrating a change of the number of bits of a CRC code according to an example 2 of the fourth embodiment.
Figure 26:
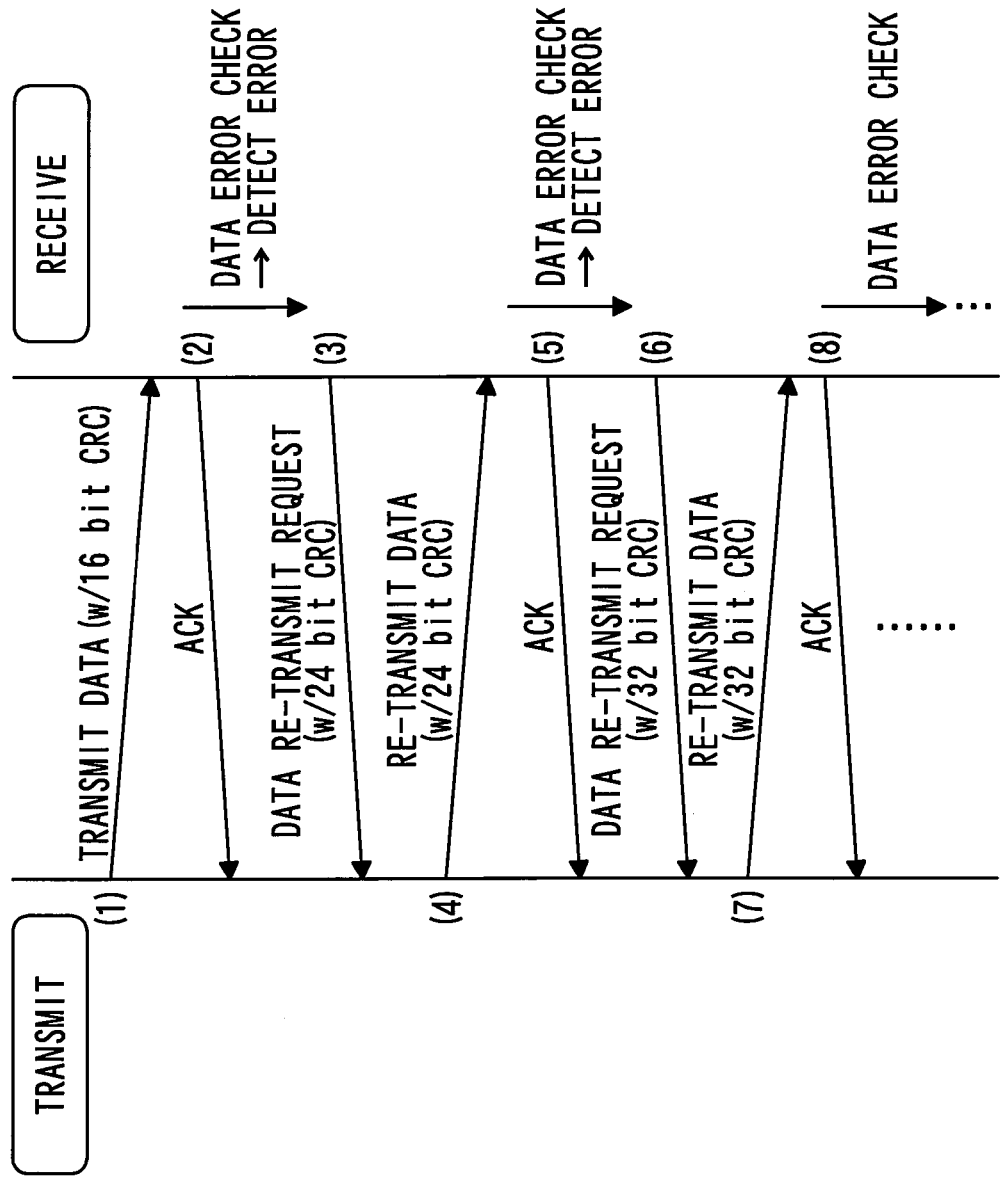
FIG. 26 is a diagram illustrating a processing sequence during transmission and reception according to the example 2 of the fourth embodiment.
Figure 27:
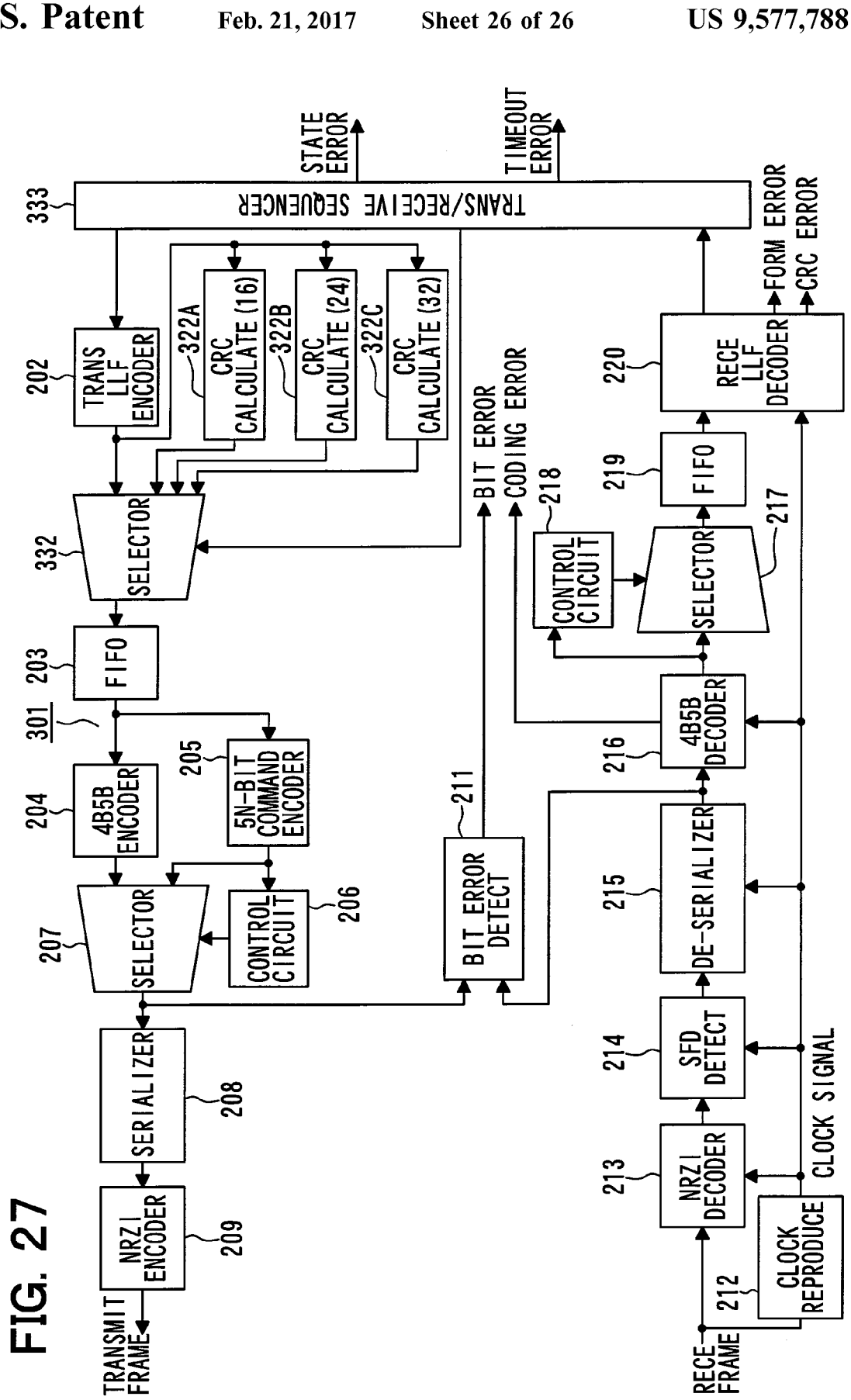
FIG. 27 is a functional block diagram illustrating a configuration of a data communication apparatus according to the example 2 of the fourth embodiment.

FIGS. 25 to 27 illustrate an example 2 of the fourth embodiment. The same devices or the like as those of the example 1 are assigned with the same reference numbers. Explanation is made mainly for different parts and omitted for the same devices or the like. The example 2 provides a process where the bit number of the CRC code changes dynamically in the error detection portion during the communication process. FIG. 25 illustrates the process on a conceptual basis. For example, under the communication environment with little number of times of error detections due to little disturbance, the bit number of the CRC code is maintained to be 16 bits. In contrast, when the detection of the CRC error becomes more frequent, the bit number of the CRC code is increased to 24 bits and 32 bits in order.

FIG. 26 illustrates a processing sequence between the transmission side and the reception side. FIG. 27 illustrates a configuration of the data communication apparatus 331 according to the example 2. The data communication apparatus 331 includes three CRC calculation portions 322A to 322C, which generate the CRC codes of 16 bits, 24 bits, and 32 bits, respectively. The CRC codes generated and outputted by the CRC calculation portions 322A to 322C are inputted into the selector 323. The switching control of the selector 323 is executed by the transmission and reception sequencer 333.

As illustrated in FIG. 26, (1) first, the transmission side transmits a frame using the 16-bit CRC code by the CRC calculation portion 322A. (2) The reception side receives the transmitted frame, replies an ACK frame, and performs an error checking, thereby detecting an error. (3) The reception side transmits a frame, which contains or issues a request of a re-transmission of the data which will be attached with the 24-bit CRC code, to the transmission side. The transmission side receives the request of re-transmission, and, thereby, changes to use the CRC calculation portion 322B. (4) The transmission side re-transmits the data attached with the 24-bit CRC code. (5) The reception side replies an ACK frame upon receiving the data that is re-transmitted, and executes an error checking using the 24-bit CRC code. The reception side detects an error. (6) The reception side transmits a frame, which contains or issues a request of re-transmission of a data that will be attached with the 32-bit CRC code, to the transmission side. The transmission side receives the above frame containing the request of re-transmission, and, thereby, changes to use the CRC calculation portion 322C. (7) The transmission side re-transmits the data which is attached with the 32-bit CRC code. (8) The reception side receives the re-transmitted data and then replies an ACK frame. In the example illustrated in FIG. 26, the increase in the bit number of the CRC code is requested shortly after the CRC error is detected. There is no need to be limited thereto. A CRC error detection frequency per a predetermined time may be defined in the communication using the 16-bit CRC code. When the CRC error detection frequency exceeds a predetermined threshold value, the increase in the bit number of the CRC code may be requested.

According to the example 2, the reception side requests the change of the bit number of the CRC code to the transmission side depending on the request frequency of re-transmission. The transmission side changes the bit number of the error detection code according to the request. Therefore, the accuracy of error detection can be changed according to the communication environment.

The present embodiment is not limited only to the above-mentioned examples, and can be modified or extended as follows. The control-use error detection code may be prepared only for the control information portion. The state error detection device or means, the timeout error detection device or means, the bit error detection device or means, the coding error detection device or means, or the form error detection device or means may be provided as needed. The data communication apparatus 301, 331 may be a node connected to an in-vehicle LAN, or a node connected to any LAN other than the in-vehicle LAN. The above embodiment may apply to the communication system in which the data frame having the highest communication frequency is one having a ID length other than the 12-bit length. Further, the above embodiment may apply to the communication system in which the frame having the second highest communication frequency is the command frame instead of the ACK frame.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A coding apparatus comprising:
a data conversion device to perform a conversion of a 4-bit data having a 4-bit string into a 5-bit data pattern having a 5-bit string;
a command conversion device to perform a conversion of a command into a 5N-bit command pattern having a 5N-bit string, wherein the N is a natural number that is two or more; and
an NRZI conversion device to perform a conversion of the 5-bit data pattern and the 5N-bit command pattern into NRZI codes to allow clock extraction at a receiver, wherein the NRZI signifies No Return to Zero/Invert on ones,
wherein:
the data conversion device performs the conversion into the 5-bit data pattern having the 5-bit string in which
 (i) a number of bits of consecutive "0" data values is permitted to be maximum two, and, simultaneously,
 (ii) maximum one bit of head end two bits is permitted to have a "0" data value and maximum one bit of tail end two bits is permitted to have a "0" data value;
the command conversion device performs the conversion into the 5N-bit command pattern having the 5N-bit string having N 5-bit patterns,
 the N 5-bit patterns including one 5-bit pattern in which a maximum number of bits of consecutive "0" data values is two and the consecutive two "0" data values are only positioned in either (a) head end two bits of the one 5-bit pattern or (b) tail end two bits of the one 5-bit pattern,
in an entity of the 5N-bit string having N 5-bit patterns,
 (i) a number of bits contained in consecutive "0" data values is permitted to be a maximum two that are neither positioned in head end two bits of the 5N-bit string nor tail end two bits of the 5N-bit string, and, simultaneously,
 (ii) maximum one bit of the head end two bits is permitted to have a "0" data value and maximum one bit of the tail end two bits is permitted to have a "0" data value.

2. The coding apparatus according to claim 1, wherein:
the command conversion device performs the conversion into the 5N-bit command pattern having the 5N-bit string in which a 5-bit string of any consecutive five bits do not overlap with the 5-bit string of the 5-bit data pattern.

3. The coding apparatus according to claim 1, wherein:
the command includes a communication synchronization command that is in use of a communication synchronization and a frame start command that indicates a start of a communication frame; and
the command conversion device performs the conversion of the communication synchronization command and the frame start command into a 5N-bit combined command pattern, which combines serially the communication synchronization command and the frame start command, such that (i) the combined command pattern contains a command pattern of the frame start command itself but does not contain another same command pattern as the command pattern of the frame start command, and (ii) a sign of a final bit of the frame start command having undergone the conversion by the NRZI conversion device is different from a sign of a final bit of the communication synchronization command having undergone the conversion by the NRZI conversion device.

4. The coding apparatus according to claim 1, wherein:
the command conversion device further performs a conversion of each of (i) a communication synchronization command that is in use of a communication synchronization and (ii) a frame start command that indicates a start of a communication frame; and
when the N is set to 2, the command conversion device converts the communication synchronization command into a pattern "1111111111", and converts the frame start command into a pattern "1111100110".

5. The coding apparatus according to claim 1, wherein:
the command before undergoing the conversion and the 4-bit data before the conversion are assigned with identification bits for identifying the command and the 4-bit data, respectively,
the coding apparatus further comprising: a selection device to selectively output a data having undergone the conversion by the data conversion device and a command having undergone the conversion by the command conversion device; and
a data/command identification device to output a selection switch signal to the selection device by referring to the identification bit.

6. The coding apparatus according to claim 1, further comprising:
a selection device to selectively output a data having undergone the conversion by the data conversion device and a command having undergone the conversion by the command conversion device; and
a data detection device to output a data detection signal to indicate that a data which is a target of the conversion by the data conversion device is inputted,
wherein:
the command conversion device outputs 5N-bit command patterns, which have previously undergone conversions, in a predetermined order based on a time point of a change of the data detection signal; and
the selection device selects one of the data and the command, according to the data detection signal.

7. A coding method comprising:
converting a 4-bit data that is inputted into a 5-bit data pattern having a structure where
  (i) a number of bits of consecutive "0" data values is permitted to be maximum two, and
  (ii) maximum one bit of head end two bits is permitted to have a "0" data value and maximum one bit of tail end two bits is permitted to have a "0" data value;
converting a command into a 5N-bit command pattern in which a number of bits contained in consecutive "0" data values is permitted to be maximum two, wherein N is a natural number that is two or more; and
converting the 5-bit data pattern and the 5N-bit command pattern into NRZI codes to allow clock extraction at a receiver, wherein the NRZI signifies No Return to Zero/Invert on ones
wherein
at the conversion into the 5N-bit command pattern having a 5N-bit string having N 5-bit patterns,
  the N 5-bit patterns including one 5-bit pattern in which a maximum number of bits of consecutive "0" data values is two and the consecutive two "0" data values are only positioned in either (a) head end two bits of the one 5-bit pattern or (b) tail end two bits of the one 5-bit pattern, and
  in an entity of the 5N-bit string having N 5-bit patterns,
  (i) a number of bits of consecutive "0" data values is permitted to be maximum two that are neither positioned in head end two bits of the 5N-bit string nor tail end two bits of the 5N-bit string, and, simultaneously,
  (ii) maximum one bit of the head end two bits is permitted to have a "0" data value and maximum one bit of the tail end two bits is permitted to have a "0" data value.

8. The coding method according to claim 7, wherein:
the 5N-bit command pattern contains a 5-bit string of any consecutive five bits that does not overlap with the 5-bit string of the 5-bit data pattern.

9. The coding method according to claim 7, wherein:
the command includes a communication synchronization command that is in use of a communication synchronization and a frame start command that indicates a start of a communication frame; and
the communication synchronization command and the frame start command are converted into a 5N-bit combined command pattern, which combines serially the communication synchronization command and the frame start command, such that (i) the combined command pattern contains a command pattern of the frame start command itself but does not contain another same command pattern as the command pattern of the frame start command, and (ii) a sign of a final bit of the frame start command having undergone the conversion into an NRZI sign is different from a sign of a final bit of the communication synchronization command having undergone the conversion into the NRZI sign.

10. The coding method according to claim 7, further comprising:
performing a conversion of each of (i) a communication synchronization command that is in use of a communication synchronization and (ii) a frame start command that indicates a start of a communication frame,
wherein:
when the N is set to 2, the communication synchronization command is converted into a pattern "1111111111", and the frame start command is converted into a pattern "1111100110".

11. The coding method according to claim 7, wherein:
the command before undergoing the conversion and the 4-bit data before the conversion are assigned with identification bits for identifying the command and the 4-bit data, respectively; and
a data having undergone the conversion and a command having undergone the conversion are selectively outputted by referring to the identification bit.

12. The coding method according to claim 7, wherein:
5N-bit command patterns, which have previously undergone conversions, are outputted in a predetermined order based on a time point of a change of a data detection signal that indicates a data which is a conversion target is inputted; and
one of the data and the command is selected according to the data detection signal.

13. A coding apparatus comprising:
a data conversion device to perform a conversion of a 4-bit data having a 4-bit string into a 5-bit data pattern having a 5-bit string;
a command conversion device to perform a conversion of a command into a 5N-bit command pattern having a 5N-bit string, wherein the N is a natural number that is two or more; and
an NRZI conversion device to perform a conversion of the 5-bit data pattern and the 5N-bit command pattern into NRZI codes to allow clock extraction at a receiver, wherein the NRZI signifies No Return to Zero/Invert on ones, wherein:

the data conversion device performs the conversion into the 5-bit data pattern having the 5-bit string in which (i) a number of bits of consecutive "0" data values is permitted to be maximum two, and, simultaneously, (ii) maximum one bit of head end two bits is permitted to have a "0" data value and maximum one bit of tail end two bits is permitted to have a "0" data value; and the command conversion device performs the conversion into the 5N-bit command pattern having the 5N-bit string in which a number of bits contained in consecutive "0" data values is permitted to be maximum two, wherein:

the command includes a communication synchronization command that is in use of a communication synchronization and a frame start command that indicates a start of a communication frame; and the command conversion device performs the conversion of the communication synchronization command and the frame start command into a 5N-bit combined command pattern, which combines serially the communication synchronization command and the frame start command, such that (i) the combined command pattern contains a command pattern of the frame start command itself but does not contain another same command pattern as the command pattern of the frame start command, and (ii) a sign of a final bit of the frame start command having undergone the conversion by the NRZI conversion device is different from a sign of a final bit of the communication synchronization command having undergone the conversion by the NRZI conversion device.

14. The coding apparatus according to claim 13, wherein: when the N is set to 2, the command conversion device converts the communication synchronization command into a pattern "1111111111", and converts the frame start command into a pattern "1111100110".

15. A coding apparatus comprising:

a data conversion device to perform a conversion of a 4-bit data having a 4-bit string into a 5-bit data pattern having a 5-bit string;

a command conversion device to perform a conversion of a command into a 5N-bit command pattern having a 5N-bit string, wherein the N is a natural number that is two or more; and an NRZI conversion device to perform a conversion of the 5-bit data pattern and the 5N-bit command pattern into NRZI codes to allow clock extraction at a receiver, wherein the NRZI signifies No Return to Zero/Invert on ones, wherein:

the data conversion device performs the conversion into the 5-bit data pattern having the 5-bit string in which (i) a number of bits of consecutive "0" data values is permitted to be maximum two, and, simultaneously, (ii) maximum one bit of head end two bits is permitted to have a "0" data value and maximum one bit of tail end two bits is permitted to have a "0" data value; and the command conversion device performs the conversion into the 5N-bit command pattern having the 5N-bit string in which a number of bits contained in consecutive "0" data values is permitted to be maximum two, the coding apparatus further comprising:

a selection device to selectively output a data having undergone the conversion by the data conversion device and a command having undergone the conversion by the command conversion device; and a data detection device to output a data detection signal to indicate that a data which is a target of the conversion by the data conversion device is inputted, wherein:

the command conversion device outputs 5N-bit command patterns, which have previously undergone conversions, in a predetermined order based on a time point of a change of the data detection signal; and the selection device selects one of the data and the command, according to the data detection signal.

16. A coding method comprising:

converting a 4-bit data that is inputted into a 5-bit data pattern having a structure where (i) a number of bits of consecutive "0" data values is permitted to be maximum two, and (ii) maximum one bit of head end two bits is permitted to have a "0" data value and maximum one bit of tail end two bits is permitted to have a "0" data value;

converting a command into a 5N-bit command pattern in which a number of bits contained in consecutive "0" data values is permitted to be maximum two, wherein the N is a natural number that is two or more; and converting the 5-bit data pattern and the 5N-bit command pattern into NRZI codes to allow clock extraction at a receiver, wherein the NRZI signifies No Return to Zero/Invert on ones, wherein:

the command includes a communication synchronization command that is in use of a communication synchronization and a frame start command that indicates a start of a communication frame; and the communication synchronization command and the frame start command are converted into a 5N-bit combined command pattern, which combines serially the communication synchronization command and the frame start command, such that (i) the combined command pattern contains a command pattern of the frame start command itself but does not contain another same command pattern as the command pattern of the frame start command, and (ii) a sign of a final bit of the frame start command having undergone the conversion into the NRZI sign is different from a sign of a final bit of the communication synchronization command having undergone the conversion into the NRZI sign.

17. The coding method according to claim 16, wherein: when the N is set to 2, the communication synchronization command is converted into a pattern "1111111111", and the frame start command is converted into a pattern "1111100110".

18. A coding method comprising:

converting a 4-bit data that is inputted into a 5-bit data pattern having a structure where (i) a number of bits of consecutive "0" data values is permitted to be maximum two, and (ii) maximum one bit of head end two bits is permitted to have a "0" data value and maximum one bit of tail end two bits is permitted to have a "0" data value;

converting a command into a 5N-bit command pattern in which a number of bits contained in consecutive "0" data values is permitted to be maximum two; and converting the 5-bit data pattern and the 5N-bit command pattern into NRZI codes to allow clock extraction at a receiver, wherein the NRZI signifies No Return to Zero/Invert on ones, wherein:

5N-bit command patterns, which have previously undergone conversions, are outputted in a predetermined order based on a time point of a change of a data detection signal that indicates a data which is a conversion target is inputted; and one of the data and the command is selected according to the data detection signal.

\* \* \* \* \*